United States Patent [19]
Chang et al.

[11] Patent Number: 5,955,893
[45] Date of Patent: Sep. 21, 1999

[54] POWER SAVING BUFFER CIRCUIT BUFFER BIAS VOLTAGES

[75] Inventors: Kuen-Long Chang, Taipei; Chun-Hsiung Hung, Hsin-Chu; Yin-Shang Liu, Tsao-Twen, all of Taiwan

[73] Assignee: Macronix International Co., Ltd., Hsinchu, Taiwan

[21] Appl. No.: 08/767,447

[22] Filed: Dec. 16, 1996

[51] Int. Cl.$^6$ .................... H03K 19/0175; H03K 19/094
[52] U.S. Cl. ................... 326/71; 326/81; 326/121
[58] Field of Search .................... 326/71, 81, 34, 326/24, 27, 121

[56] References Cited

U.S. PATENT DOCUMENTS

| | | |
|---|---|---|
| 4,471,242 | 9/1984 | Noufer et al. . |
| 4,672,243 | 6/1987 | Kirsch ........................................ 326/71 |
| 4,717,836 | 1/1988 | Doyle . |
| 4,786,830 | 11/1988 | Foss .......................................... 326/71 |
| 4,791,323 | 12/1988 | Austin ....................................... 326/71 |
| 4,818,901 | 4/1989 | Young et al. ............................. 326/27 |
| 4,825,106 | 4/1989 | Tipon et al. .............................. 326/34 |
| 5,034,623 | 7/1991 | McAdams ................................ 326/62 |
| 5,036,226 | 7/1991 | Tonnu et al. ............................. 326/71 |
| 5,144,167 | 9/1992 | McClintock ............................. 326/71 |
| 5,151,620 | 9/1992 | Lin . |
| 5,304,867 | 4/1994 | Morris . |
| 5,565,795 | 10/1996 | Kawano ................................... 326/81 |

OTHER PUBLICATIONS

Veendrick, H., "Short–Circuit Dissipation of Static CMOS Circuitry and Its Impact on the Design of Buffer Circuits", Journal of Solid–State Circuits, vol. SC–19, No. 4, pp. 468–474, Aug. 1984.

Weste, et al., "Principles of CMOS VLSI Design, A Systems Perspective", Addison–Wesley Publishing Company, pp. 43–49 (1985).

*Primary Examiner*—Michael Tokar
*Assistant Examiner*—Daniel Chang
*Attorney, Agent, or Firm*—Haynes & Beffel LLP

[57] ABSTRACT

An embodiment of the invention provides a buffer circuit having reduced power consumption. The buffer circuit comprises a power saving switch coupled to a buffer at a bias node. The buffer has an input that is adapted to receive input voltages at TTL levels, for example, and has an output adapted to provide output voltages at CMOS levels, for example. The power saving switch includes a level shifter and a voltage control circuit both coupled to the bias node. The output voltage of the buffer is fed back to the power saving switch. When the output voltage is at a low CMOS level, the power saving switch uses the voltage control circuit to provide a first bias voltage to the bias node. When the output voltage is at a high CMOS level, the power saving switch uses the level shifter to provide a second bias voltage to the bias node. The second bias voltage is chosen such that it prevents current flow between the bias node and the buffer at a predetermined input cutoff voltage. The level shifter provides a relatively constant second bias voltage by providing a relatively constant voltage shift $V_{LS}$ between a level shifter reference voltage $V_{ref}$ and the bias node. In the present embodiment, this voltage shift $V_{LS}$ is the absolute value of the gate to source threshold voltage of a FET. Accordingly, the second bias voltage is $V_{ref}-V_{LS}$. In one embodiment, the voltage control circuit includes a second level shifter to provide the first bias voltage.

47 Claims, 13 Drawing Sheets

POWER SAVING BUFFER CIRCUIT BUFFER BIAS VOLTAGES

BACKGROUND OF THE INVENTION

1. Field of the Invention

The field of the invention relates generally to buffers and more particularly to a power saving buffer circuit that may be used to interface a TTL logic circuit to a CMOS logic circuit, for example.

2. Background

Conventional circuits often involve interfaces between different logic families, such as TTL and CMOS. Often the different logic families represent high and low logic levels using different voltage levels. For example, a TTL circuit may represent a high logic level with a voltage in the range of about 2.4 to 5 volts, and it may represent a low logic level with a voltage in the range of about 0 to 0.8 volts. A CMOS circuit, on the other hand, may represent a high logic level with a voltage in the range of about 4.7 to 5 volts and a low logic level with a voltage in the range of about 0 to 0.3 volts. Accordingly, a buffer that interfaces a TTL circuit to a CMOS circuit, for example, typically must convert TTL high logic voltages to CMOS high logic voltages and TTL low logic voltages to CMOS low logic voltages.

FIG. 1 illustrates a conventional TTL to CMOS buffer 100 that accomplishes such a conversion. Buffer 100 includes two invertors 106 and 108. In operation, when input 102 is at a TTL low level, output 104 is at a CMOS low level. In this state, transistor 112 is on while transistor 1 14 is off, pulling node 110 to a high logic level (e.g. $V_{DD}$). Inverter 108 inverts the high level at node 110 to provide a CMOS low logic level at output 104. When input 102 is at a TTL high level, on the other hand, output 104 is at a CMOS high level. In this state, transistor 112 is off while transistor 114 is on, pulling node 110 to low logic level (e.g. ground). Inverter 108 inverts the low level at node 110 to a CMOS high logic level at output 104. Inverter 108 can be constructed in the same manner as inverter 106. If so, it will provide a CMOS high level that corresponds to reference voltage 120 (e.g. $V_{DD}$) and a CMOS low level output that corresponds to reference 122 (e.g. ground).

Under ideal conditions, buffer 100 typically consumes little power when a TTL high (e.g. about 4.7 volts) or a TTL low (e.g. about 0.4 volts) logic level is applied to input 102. As described, either transistor 112 or transistor 114 typically will be off, and no current path will exist from $V_{DD}$ to ground. As is known in the art, however, this buffer typically consumes power when switching between high and low logic levels. In particular, during switching, both transistors 112 and 114 may be on simultaneously, enabling a switching current to flow from $V_{DD}$ to ground. Please see N. Weste and K. Eshraghian, *Principles of CMOS VLSI Design, A System Perspective*, Addison-Wesley Publ. Co. 1988, pp. 43–49 for a discussion of the operation of inverter 106 and this switching current.

In addition, some modern systems have been using lower TTL high logic voltages for speed, power savings or other reasons. A system might use an "intermediate" TTL high voltage of about 2 volts, for example, which is below the 2.4 to 5 volts high logic voltages used in other applications. Where such an intermediate voltage is used, buffer 100 undesirably may consume power even under static conditions. Such an "intermediate" high logic level, for example, may not provide a high enough voltage to turn off transistor 112 when input 102 is high. Accordingly, both transistors 112 and 114 may be on simultaneously and a current may flow from $V_{DD}$ to ground even after input 102 has fully completed the transition from a low logic level to a high logic level, for example. Such a "static" current may prevent a system designer from meeting the desired power constraints of a particular system. This static power consumption can be even more important if it occurs in a modern low power system, such as some type of portable electronic equipment. If the lower voltage was originally used to reduce power consumption, for example, this static current can reduce the benefits obtained from the lower voltage.

Efforts have been made to address this issue in TTL to CMOS buffers. Please see, for example, U.S. Pat. No. 5,304,867 to Morris entitled CMOS Input Buffer With High Speed and Low Power, U.S. Pat. No. 4,471,242 to Noufer et al entitled TTL to CMOS Input Buffer and U.S. Pat. No. 5,151,620 to Lin entitled CMOS Input Buffer With Low Power Consumption. Unfortunately, a technique used to reduce a buffer's power consumption may itself consume undesirable amounts of power. Alternatively, the power savings obtained may be limited by concerns related to buffer speed or, for other reasons, may simply fail to achieve the desired level of savings. Power saving techniques may also require undesired amounts of additional circuitry.

The Morris patent, for example, biases a transistor 27 to provide a resistance means for reducing the power consumed by a buffer. This patent states, however, that a lower limit is placed on the power savings of this design because there is an upper limit on the resistance that this transistor can provide. In particular, it states that this transistor must have a resistance low enough to maintain node 29 at a high level. Please see Morris, Col. 2, line 45–Col. 3, line 7.

In addition to power consumption, conventional logic buffers may not provide the desired immunity to noise. FIG. 2 illustrates a hysteresis characteristic that may be desired in a logic buffer that converts between logic levels of two different logic families. Such a hysteresis characteristic may enable a logic buffer to achieve a desired level of noise immunity. As illustrated in FIG. 2, the input voltages represent logic levels according to a first logic family. $V_{TL}$ is the input voltage at which a high to low input transition causes the output voltage to transition from a high logic level $V_{OH}$ to a low logic level $V_{OL}$. $V_{TH}$ is the input voltage at which a low to high input transition causes the output voltage to transition from a low logic level $V_{OL}$ to a high logic level $V_{OH}$. $V_{OL}$ and $V_{OH}$ are the low and high logic output voltages, respectively, of a second logic family to which the input low and high voltage levels are converted. $V_{IL}$ is an expected input low logic level and $V_{IH}$ is an expected input high logic level of a particular system or circuit design. This hysteresis characteristic can operate to reduce sensitivity to noise. Unfortunately, conventional buffers may not achieve the desired hysteresis characteristic.

Accordingly, there has been a need for an improved logic buffer that reduces the power consumed by the buffer without unacceptably affecting the speed of the buffer and without unacceptably increasing the complexity of the buffer circuit. There has also been a need for a logic buffer that exhibits improved noise immunity.

SUMMARY OF THE INVENTION

An aspect of the present invention is to provide a buffer circuit having reduced static and switching power consumption.

Another aspect of the present invention is to provide a power saving buffer circuit that does not unacceptably increase the complexity of the buffer circuit.

Another aspect of the present invention is to provide a buffer circuit that has improved immunity to noise.

In particular, an embodiment of the invention includes a buffer input. This input receives an input voltage that represents high and low logic levels using high and low ranges of voltages. The embodiment includes two transistors each having a gate, a source and a drain. The gates of these transistors are coupled to the buffer input. The source of a first of these transitors is coupled to a bias node and the drain of this first transistor is coupled to an input of an invertor. One of the drain and source of the second transistor is coupled to a reference node and the other of the drain and source of this second transistor is coupled to the invertor input. The reference node is configured to provide a reference voltage. This embodiment also includes a supply node for providing a supply voltage. The invertor is coupled to the supply node and the reference node and provides the output of the embodiment. The embodiment provides an output voltage that represents high and low logic levels using high and low ranges of voltages. A voltage control circuit, which is controlled by the output voltage, controls the voltage at the bias node. In particular, this voltage control circuit works in conjunction with a level shifter to provide the bias node alternatively with a first bias voltage or a second bias voltage. In the present embodiment, the first bias voltage is provided when the output voltage is at one of a low or high logic level and a second bias voltage is provided when the output voltage is at the other of the low or high logic level. A level shifter reference voltage, which is coupled to the level shifter and is used to provide the second bias voltage. The first bias voltage can be at substantially the same voltage level as the supply voltage, or in the alternative, at a voltage level that has a smaller magnitude than the supply voltage but a greater magnitude than the second bias voltage. If the latter, the voltage control circuit in the present embodiment uses a second level shifter and a second level shifter reference voltage to provide the first bias voltage. In the present embodiment, the second bias voltage is less than the sum of the absolute value of the threshold voltage of the first transistor and an input cutoff voltage. The input cutoff voltage in this embodiment is the voltage at which the first transistor turns off when the second bias voltage is provided at the bias node and the input cutoff voltage is applied to the buffer input.

In one embodiment, the input logic range of voltages are TTL logic levels and the output logic range of voltages are CMOS logic levels.

In another embodiment, the invertor comprises two transistors wherein the gates of the two transistors provide the invertor input, the source of the first transistor is coupled to the supply node and the source of the second transistor is coupled to the reference node and the drains of the two transistors are coupled together to provide the output of the buffer.

Another embodiment of the invention, for example, provides a buffer circuit that comprises a power saving switch and a buffer. The power saving switch is coupled to the buffer at a bias node. The buffer has an input that is adapted to receive a cutoff voltage and an output adapted to provide an output voltage in a first and second range of voltages. This embodiment controls the power consumed by the buffer both during switching and when the buffer is in a static state by using a level shifter and a voltage control circuit to control a bias voltage at the bias node. The output voltage of the buffer is fed back to the power saving switch to determine whether the voltage control circuit or the level shifter will provide the bias voltage and whether a first bias voltage will be provided by the voltage control circuit or whether a second bias voltage will be provided by the level shifter. The power saving switch is adapted to provide the first bias voltage when the output voltage is in the first range and to provide the second bias voltage when the output voltage is in the second range. The voltage difference between the second bias voltage and the input cutoff voltage is designed to prevent current flow between the bias node and the buffer when the second bias voltage is applied at the bias node and the input cutoff voltage is applied at the input. Accordingly, this feedback enables the power saving switch to achieve power savings without adding undue complexity while maintaining an acceptable level of performance and while enhancing the noise immunity of the buffer. In this embodiment, the bias node is coupled to the source of a transistor in the level shifter, and a level shifter reference voltage is coupled to the gate of this transistor so that the bias voltage is controlled by this level shifter reference voltage and the threshold voltage of this transistor. In an alternate embodiments of the invention, the first bias voltage can have a level substantially the same as the supply voltage or a level having a smaller magnitude than the supply voltage. In the latter embodiment, the voltage control circuit includes a second level shifter to provide the first bias voltage.

DETAILED DESCRIPTION

Embodiments of the invention provide a novel power saving logic buffer. The following description is presented to enable a person skilled in the art to make and use the invention. Descriptions of specific embodiments are provided only as examples. Various modifications to the described embodiments may be apparent to those skilled in the art, and the generic principles defined herein may be applied to other embodiments and applications without departing from the spirit and scope of the invention. Thus, the present invention is not intended to be limited to the described or illustrated embodiments, but is to be accorded the widest scope consistent with the principles and features disclosed herein.

Figure 1:
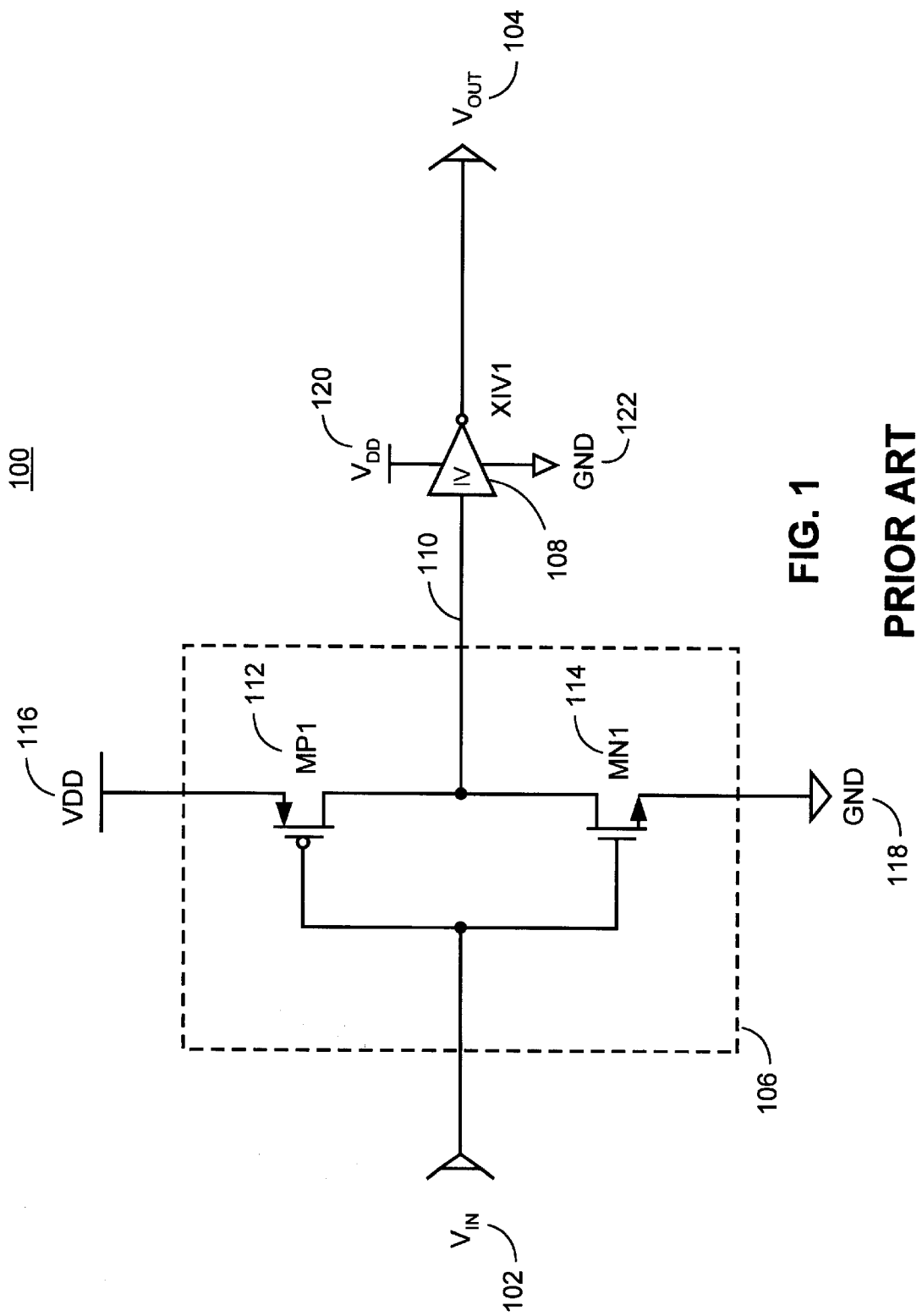
FIG. 1 illustrates a conventional TTL to CMOS buffer.
Figure 3:
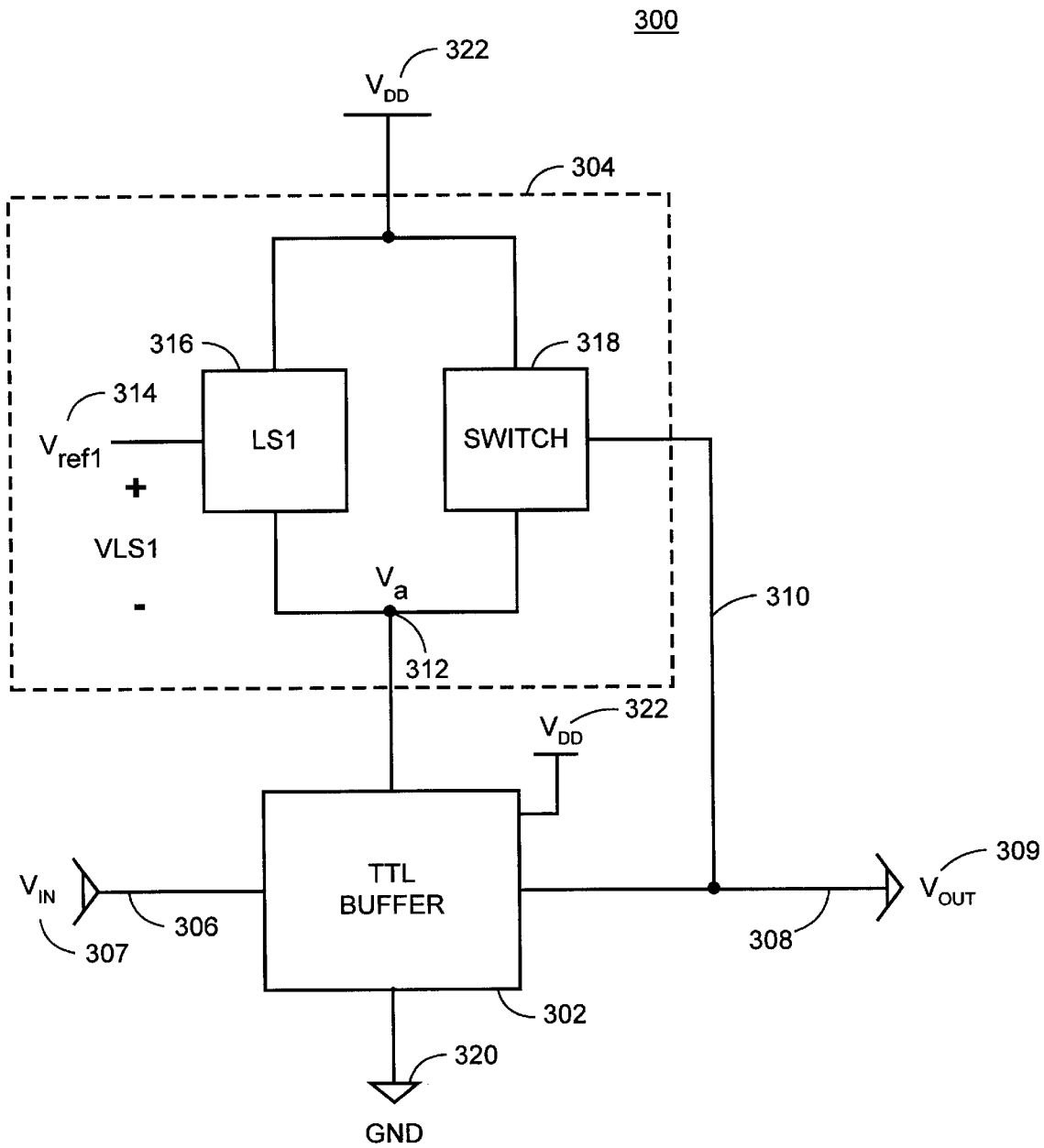
FIG. 3 is a block diagram of a buffer 300 which is an embodiment of the present invention.

FIG. 3 is a block diagram of a TTL to CMOS buffer 300 that is an embodiment of the present invention. As illustrated, buffer 300 includes a TTL buffer 302 having input 306 for receiving an input voltage 307 and output 308 for providing output voltage 309. This buffer 302 can, but need not, be the buffer 100 illustrated in FIG. 1. Buffer 302 operates using bias voltage 312, reference voltage 320 and supply voltage 322. In the present embodiment reference voltage 320 is ground, and supply voltage 322 is $V_{DD}$. Bias voltage 312 is controlled by power saving switch 304.

The input voltage in the present embodiment represents a TTL high logic level using a TTL high range of voltages and represents a TTL low logic level using a TTL low range of voltages. In particular, a typical TTL high range of voltages could be about 2 volts or higher. A typical TTL low range of voltages could be about 0.8 volts or lower. Input voltages in other embodiments could use input logic level voltage ranges based upon logic families other than TTL. Other logic families and typical voltage ranges are known in the industry. Similarly, the output voltage in the present embodiment represents a CMOS high logic level using a CMOS high range of voltages and represents a CMOS low logic level using a CMOS low logic range of voltages. In particular, a typical high CMOS range of voltages could be about 4.7 volts or higher. A typical CMOS low range of voltages could be about 0.3 volts or lower. Output voltages in other embodiments could use output logic level voltage ranges based upon logic families other than CMOS. In the present embodiment, a transition of the input voltage from a TTL low range of voltages into a TTL high range of voltages causes the output voltage to transition from a CMOS low range of voltages into a CMOS high range of voltages, and a transition of the input voltage from a TTL high range of voltages into a TTL low range of voltages causes the output voltage to transition from a CMOS high range of voltages to a CMOS low range of voltages. The hysteresis characteristics of several implementations of the present embodiment are discussed below.

The power saving switch 304 includes two voltage control circuits. In the present embodiment, the first voltage control circuit includes switch 318 and the second voltage control circuit includes voltage level shifter 316 and level shifter reference voltage 314. The switch 318 is coupled to the output 308 of the buffer 302 by feedback path 310. Both the switch 318 and the voltage level shifter 316 are coupled to the bias voltage 312 and the supply voltage 322. A level shifter reference voltage 314 is also coupled to level shifter 316.

The power saving switch 304 operates in two modes to control the power consumed by buffer 300. It operates in a first mode when a CMOS low output voltage is provided at output 308. In this mode, switch 304 activates the first voltage control circuit to control the bias voltage Va at node 312. In particular, switch 318 is turned on when output 308 is low. Switch 318 pulls the bias voltage Va at node 312 up to the supply voltage 322 or some voltage slightly less than voltage 322. In this mode, the second voltage control circuit does not affect the bias voltage at node 312.

Power saving switch 304 operates in a second mode when a CMOS high voltage is provided at output 308. In this mode, switch 304 uses the second voltage control circuit rather than the first voltage control circuit to control the bias voltage Va at node 312. In particular, the switch 318 is turned off by the high output voltage 309 at output 308 to deactivate the first voltage control circuit. Accordingly, the bias voltage Va at node 312 is controlled by the level shifter 316 and level shifter reference voltage 314. Shifter 316 shifts the bias voltage Va at node 312 to a voltage below supply voltage 322. In the present embodiment, shifter 316 is designed such that $$Vat = V_{ref1} - V_{LS1}$$

where $V_{ref1}$ represents the level shifter reference voltage 314, $V_{LS1}$ is a relatively constant voltage shift that shifter 316 is designed to maintain between the shifter reference voltage and node 312 and Vat is the target value of bias voltage Va. In the present embodiment, the target bias voltage Vat is chosen such that buffer 302 does not draw current from node 312 when an intermediate voltage that represents a TTL high logic level (e.g. 2.0 volts) is applied to input 306. In particular, Va is set at a target bias Vat such that $$Vat - V_{inh} < V_{tf}$$

where $V_{inh}$ is an "intermediate" input voltage that can represent a TTL high logic level and $V_{tf}$ is the maximum voltage difference between node 312 and input 306 allowed to prevent static current draw from node 312 by the TTL buffer 302. In the present embodiment, $V_{inh}$ is the smallest magnitude voltage level (i.e. the "lowest" voltage) in the input high logic range of voltages. In other embodiments, $V_{inh}$ need not be the lowest voltage in the input high logic range. The input voltage at which this embodiment is designed to prevent buffer 302 from drawing current from node 312 by turning off FET 424 when node 312 is biased to voltage Vat shall be called the input cutoff voltage. Level shifter 316 controls the bias voltage Va by maintaining a relatively constant $V_{LS1}$ even if the resistance of the components on the current path from supply voltage 322 to reference voltage 320 changes. In particular, shifter 316 maintains a relatively constant voltage shift between the shifter reference voltage 314 and node 312 even during switching of the buffer 302 and even if the resistance of buffer 302 changes, for example. Such a resistance change could occur, for example, if buffer 302 has transistors such as transistors 424 and 432 of FIG. 4 that turn on simultaneously during switching, for example, and/or have changing resistances during switching. Accordingly, in the present embodiment the bias voltage Va at node 312 is substantially independent of the voltage division along the current path from supply 322 through level shifter 316 through node 312 through buffer 302 to reference 320.

Figure 4:
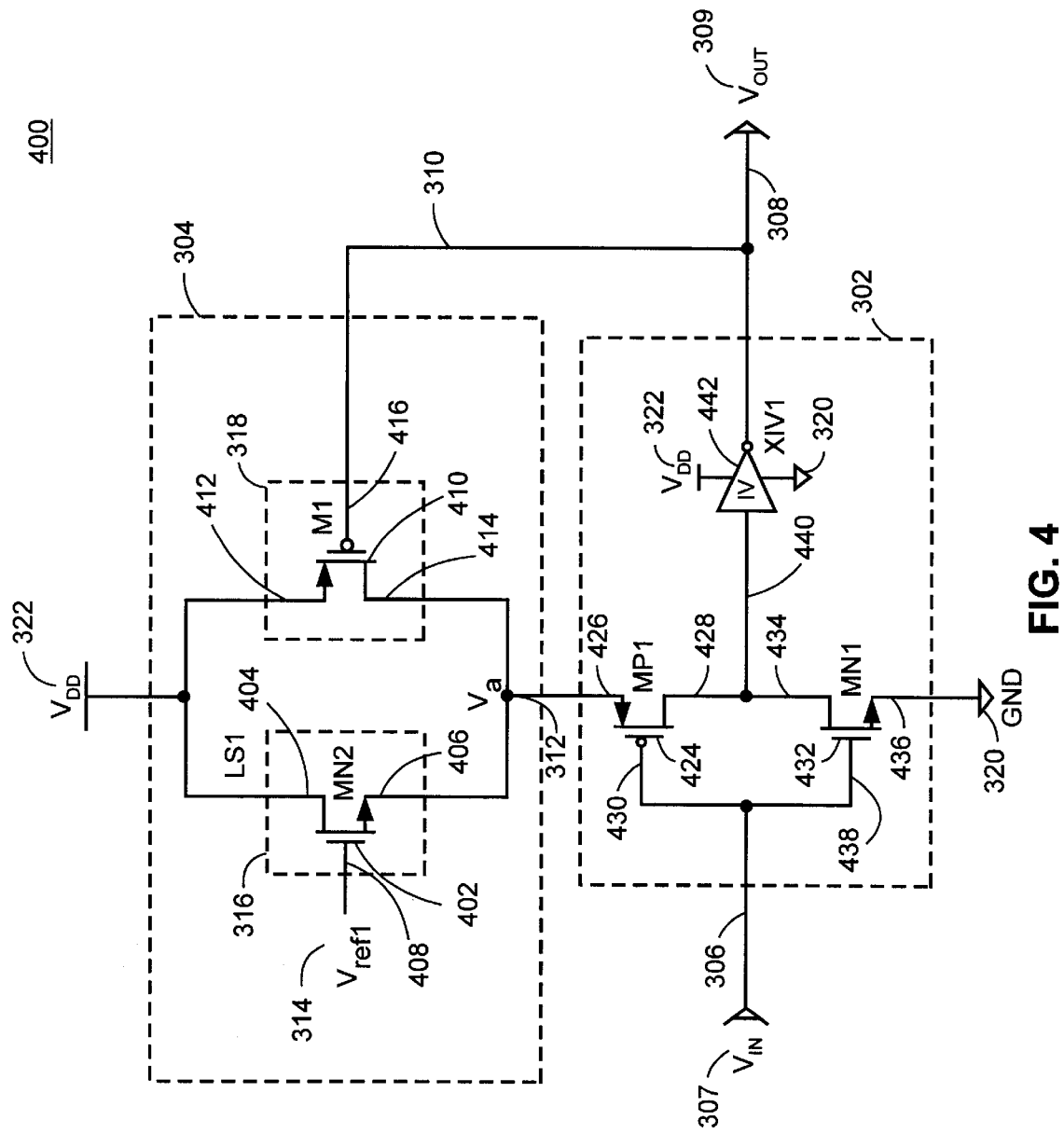
FIG. 4 is a schematic diagram of a buffer 400 which is an embodiment of the invention.

FIG. 4 shows a buffer 400 which is one possible implementation of the buffer 300 of FIG. 3. Buffer 300 is not limited to this particular implementation, however. As illustrated in FIG. 4, switch 318 of buffer 400 is a P-channel enhancement mode field effect transistor (FET) 410 having its source 412 coupled to supply voltage 322, its drain 414 coupled to bias node 312 and its gate 416 coupled to output 308 using feedback path 310. The level shifter 316 of buffer 400 is an N-channel enhancement mode FET 402 having its drain 404 coupled to supply voltage 322, its source 406 coupled to node 312 and its gate 408 coupled to the shifter reference voltage 314. The buffer 302 includes a P-channel enhancement mode FET 424 having its source 426 coupled to node 312, its drain 428 coupled to an output node 440 and its gate 430 coupled to input 306. Buffer 302 also includes an N-channel enhancement mode FET 432 having its drain 434 coupled to output node 440, its source 436 coupled to reference voltage 320 and its gate 438 coupled to input 306. Output node 440 is coupled to an input of inverter 442, and inverter 442 provides output 308 such that the voltage on output node 440 is inverted to provide at output 308 output voltage 309. Inverter 442 is coupled to supply voltage 322 and reference voltage 320 so that it provides low and high logic outputs at CMOS levels.

Buffer 400 operates in the manner described with respect to buffer 300. In particular, its first voltage control circuit, which includes FET 410, operates when output 308 is at a CMOS low level. A low CMOS level at output 308 turns on FET 410, pulling the voltage Va of bias node 312 to reference voltage 322. Bias node 312 is pulled to the reference voltage 322 because the low CMOS output level at output 308 and FET 410's gate cause FET 410 to go into its triode region where $|V_{GS410}-V_{T410}|>V_{DS410}\cdot|V_{GS410}|$ is the gate to source voltage of FET 410, $V_{T410}$ is the gate to source threshold voltage of FET 410 and $V_{DS410}$ is the drain to source voltage of FET 410. Under such a bias, FET 410 presents a low resistance and the voltage drop $V_{DS410}$ can be neglected when determining the voltage at node 312.

When output 308 is at a CMOS high level, FET 410 is switched off. The bias voltage Va of node 312 is controlled by the second voltage control circuit, which includes level shifter 316, level shifter reference voltage 314 and FET 402. Level shifter 316 and FET 402 are designed to maintain the bias voltage Va at node 312 at a target bias Vat such that $$Vat=V_{ref1}-V_{t402}$$

where $V_{ref1}$ is the level shifter reference voltage 314, $V_{t402}$ is the threshold voltage required to turn on FET 402 and Vat is the target bias voltage at node 312. The threshold voltage of FET 402 is the gate to source voltage required to turn it on. In the present embodiment the level shifter 316 and the reference voltage 314 are designed to maintain the bias voltage Va at a target bias voltage Vat such that the difference between an intermediate high logic input voltage 307 and the target voltage Vat at node 312 is less than the threshold voltage (i.e. gate to source voltage) $V_{t424}$ required to turn on FET 424. In particular, level shifter 316 is designed to maintain $$Vat-V_{inh}<|V_{t424}|; \text{ or}$$

$$Vat<V_{inh}+|V_{t424}|.$$

In the present embodiment, the intermediate high voltage level is also the lowest high input voltage level in the input high range of voltages. With Va at such a level, FET 424 will turn off when a TTL high level is received at input 306. Va is set at such a level by adjusting reference voltage 314 and choosing a FET 402 that has an appropriate threshold voltage $V_{t402}$. Accordingly, while the output 308 is at a CMOS high level and a TTL high is present at input 306, level shifter 316, reference voltage 314 and FET 402 maintain the bias voltage Va at node 312 at a target bias Vat such that FET 424 turns off even if the TTL high level at input 306 is an intermediate voltage (e.g. about 2 volts) which is lower than a typical TTL high voltage of 2.4 to 5 volts. Both the shifter level reference voltage 314 and the threshold voltage of FET 402 can be adjusted to maintain bias voltage Va at the desired bias voltage Vat. The input voltage at which this embodiment is designed to prevent buffer 302 from drawing current from node 312 when node 312 is biased to Vat shall be called the input cutoff voltage.

In operation, when input voltage 307 moves from a low logic level to a high logic level, both FET's 424 and 432 will be on simultaneously, allowing current to flow between reference voltages 320 and 322. The first voltage control circuit (i.e. FET 410) will also be on and node 312 will be biased to the supply voltage 322 until the output voltage 309 moves from a low logic level to a high logic level. When output voltage 309 goes high, FET 410 turns off and the second voltage control circuit (i.e. level shifter 316, reference voltage 314 and FET 402) will operate such that the bias voltage Va is reduced to about Vat to turn off FET 424, cutting off the current path between the reference voltage 320 and supply voltage 322. Because the switch 304 has been designed such that $V_{ref1}-Vat=V_{t402}$, FET 402 tends to prevent the bias voltage Va from dropping below the target voltage Vat even during switching of buffer 400 when transistors 424 and 432 are simultaneously on and their resistances are changing. In particular, the bias voltage Va is substantially independent of the voltage divider characteristics of the current path from supply 322 through FET 402 through node 312 and through FETs 424 and 432 to ground 320. Accordingly, the present embodiment maintains a relatively constant bias voltage Va at about the target bias voltage Vat. Thus, the difference between shifter reference voltage 314 and bias voltage Va is maintained at substantially the threshold voltage of FET 402.

When the input voltage 307 transitions from a high logic level to a low logic level and the input voltage 307 drops below $Va-|V_{t424}|$, FET 424 turns on causing FET 402 to turn on. During this high to low transition at input 306, node 440 transitions from a low level to a high level. FET 402 turns on to provide current to drive node 440's transition from a low level to a high level. FET 410 is still off. When node 440 reaches a sufficiently high level, however, output 308 will change to a low level, again turning on FET 410, pulling node 312 up to supply voltage 322 and turning off the second voltage control circuit. During this high to low transition at input 306, the low level reached at input 306 turns off FET 432, cutting off the current path between the reference voltage 320 and supply voltage 322.

Maintaining a relatively constant voltage Va can be important, for example, during a high to low transition at input 306. In particular, during a high to low transition at input 306, FET 402 must provide sufficient current to drive node 440's transition from a low level to a high level because FET 410 is off. If it does not, the bias voltage Va at node 312 could be pulled down, causing FET 424 to turn off more than is desired. If FET 424 turns off in this manner, it could slow the low to high transition at node 440 and ultimately slow the high to low transition at output 308.

In the present embodiment, however, if Va were to start to move down below Vat during a high to low transition at input 306 (and corresponding low to high transition at node 440), FET 402 will turn on, pulling Va back to the voltage level Vat. If bias voltage Va tended to decrease below voltage Vat, the gate to source voltage of FET 402 would increase, turning FET 402 on harder and providing more current to maintain bias voltage Va at the target bias voltage Vat. Because FET 402 turns on if bias voltage Va decreases below Vat, FET 402 provides increased drive if necessary to drive node 440's transition from a low level to a high level. Accordingly, bias voltage Va at node 312 substantially will be prevented from falling below target bias voltage Vat.

Similarly, Va substantially is prevented from moving above Vat because FET 402 will turn off if the voltage difference between $V_{ref1}$ and Va is less than $V_{t402}$. As we have noted, the present embodiment is designed such that $V_{ref1}$–Vat=$V_{t402}$. Accordingly, any such rise in Va turns off FET 402, preventing it from pulling node Va above the target bias voltage Vat. This design characteristic prevents the bias voltage Va from rising so that the difference between the bias voltage Va at node 312 and the intermediate high logic level input voltage $V_{inh}$ is no longer less than the threshold voltage of FET 424. If voltage Va rose in this manner, then FET 424 could conduct current even when the intermediate high logic level input voltage was present at input 306. Increased static current draw by buffer 400 could result.

In the present embodiment, FETs 402 and 432 (enhancement mode NMOS) are chosen to have threshold voltages ($V_{t402}$ and $V_{t432}$) of about 0.7 to 0.8 volts, FETs 410 and 424 (enhancement mode PMOS) are chosen to have threshold voltages of about –0.9 to –1 volt, the supply voltage 322 ($V_{DD}$) is about 5 volts, the reference voltage 320 is ground and the level shifter reference voltage 314 is set at about 5 volts (at or near the supply voltage $V_{DD}$). These thresholds are only examples. Other thresholds and voltages could be used.

Figure 10:
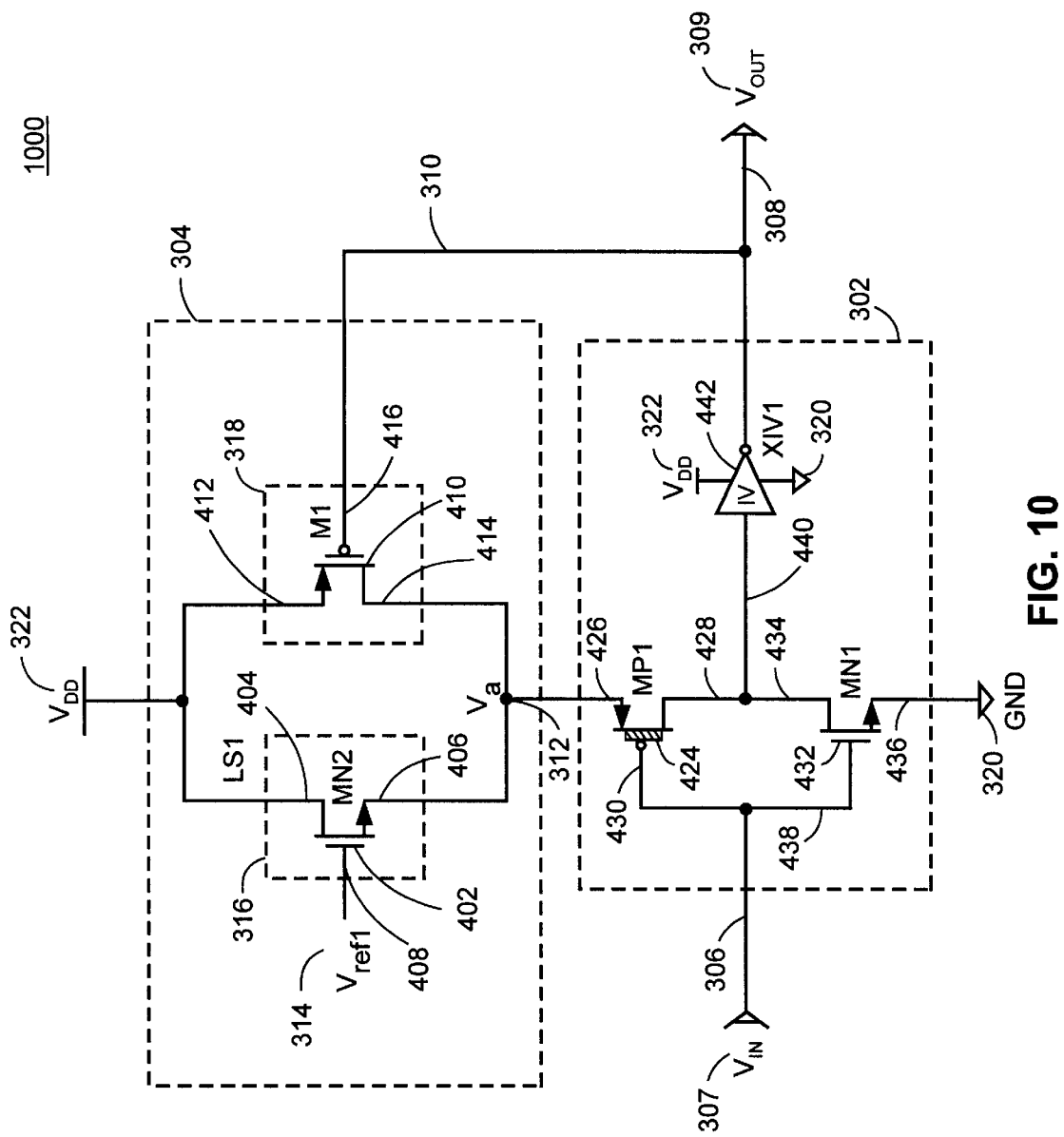
FIG. 10 is a schematic diagram of a buffer 1000 which is an alternate embodiment of the invention.

FIG. 10 illustrates buffer 1000 which is an alternate embodiment of buffer 400. Buffer 1000 is the same as buffer 400 except FET 424 is an intrinsic PMOS transistor. In particular, the channel of FET 424 in buffer 1000 is doped with the intrinsic or background concentration of its substrate. During manufacture, the channel of this FET 424 is masked during the P-type enhancement implant step. As a result, FET 424 in this embodiment has a higher magnitude threshold voltage than FET 424 in buffer 400, for example. Accordingly, in this embodiment the threshold voltage of FET 424 is about –1.4 to –1.5 volts. Changing the threshold voltage of FET 424 in this manner enables the response characteristics of the buffer to be tailored or fine tuned in a desired manner. While the threshold voltage of FET 424 has been changed by varying the channel doping, other techniques may be used.

Figure 5:
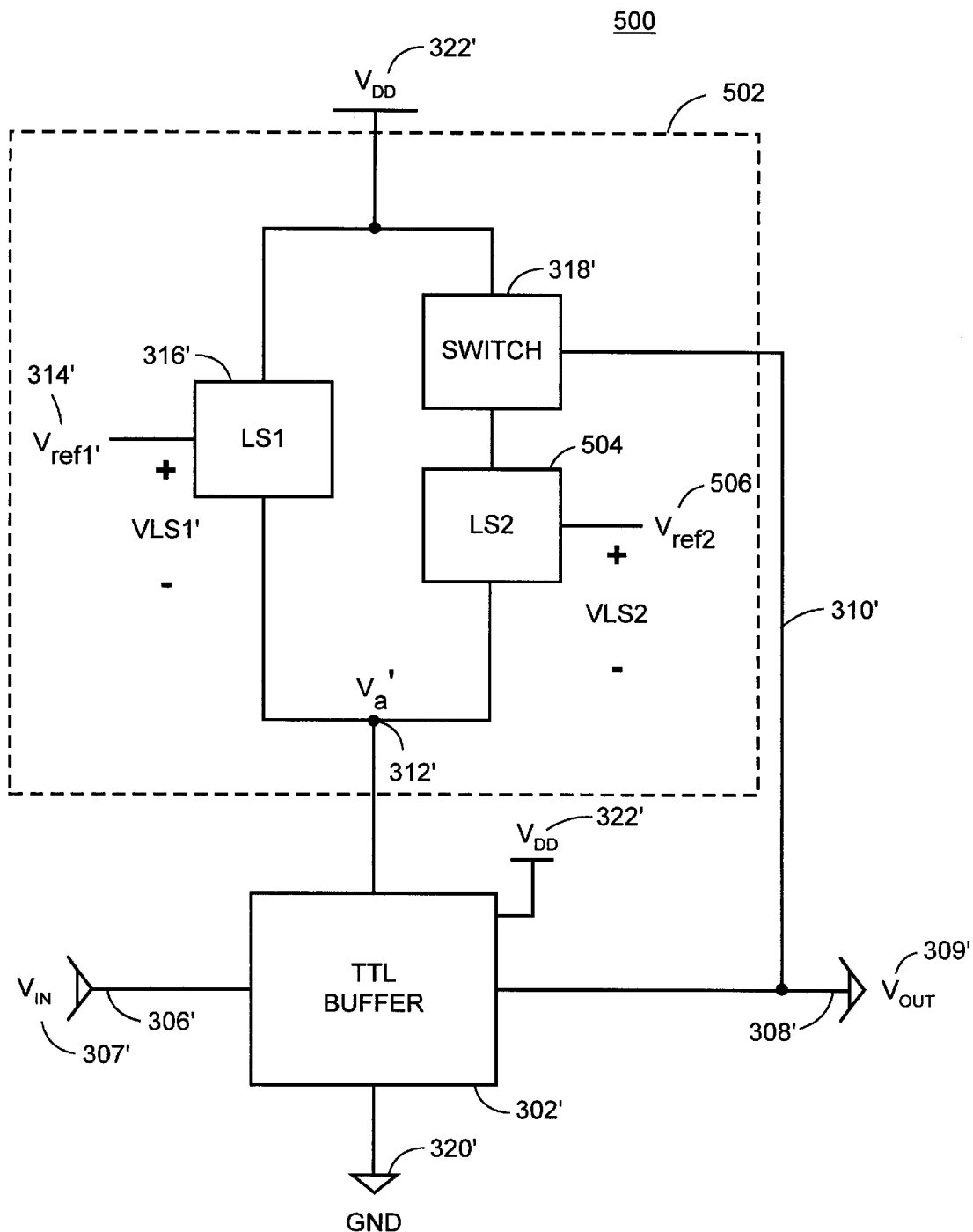
FIG. 5 is a block diagram of a buffer 500 which is an alternate embodiment of the invention.

FIG. 5 illustrates a logic buffer 500 which is an alternate embodiment of the present invention. Buffer 500 is similar to buffer 300. Buffer 500 has a power saving switch 502 and uses a buffer 302'. Components of buffer 500 that operate the same or similar to a buffer 300 component have been labeled with the same number as the buffer 300 component primed. Unlike buffer 300, buffer 500's power saving switch 502 has a level shifter in both the first voltage control circuit and the second voltage control circuit. In particular, similar to buffer 300, buffer 500's second voltage control circuit includes level shifter 316' and reference voltage 314'. Buffer 500's first voltage control circuit not only includes a switch 318', but also a voltage level shifter 504 and a level shifter reference voltage 506.

Buffer 500's power saving switch 502 operates in two modes to control the power consumed by buffer 500. Similar to switch 304, switch 502 operates in its second mode when a CMOS high voltage is provided at input 306'. In this mode, it uses the second voltage control circuit, including level shifter 316' and reference voltage 314', to control the bias voltage Va' at node 312' in the same manner as was done by buffer 300. The switch 318' is turned off by the high output voltage at output 308'. Similar to buffer 300, shifter 316' maintains the level of bias voltage Va' at node 312' at a relatively constant target bias voltage Vat' by providing a relatively constant shift voltage $V_{LS1}'$ between the level shifter reference voltage 314' and the voltage Va' at node 312'. Again, Va' is controlled such that $Vat'=V_{ref1}'-V_{LS1}'$; and $Vat'-V_{inh}'<V_{tf}'$ where Vat' is the target voltage to be produced by the second voltage control circuit at node 312', $V_{ref1}'$ is the level shifter reference voltage 314', $V_{LS1}'$ is the voltage shift generated by level shifter 316' from $V_{ref1}'$ to node 312', $V_{inh}'$ is an "intermediate" voltage that can represent a TTL high logic level and $V_{tf}'$ is the maximum voltage difference between the bias voltage at node 312' and input 306' allowed to prevent static current draw from node 312' by the buffer 302'. In this embodiment, $V_{inh}'$ is also the lowest voltage in the input high logic range of voltages although it need not be in other embodiments. The input voltage at which this embodiment is designed to prevent buffer 302' from drawing current from node 312' when node 312' is biased to voltage Vat' shall be called the input cutoff voltage. Shifter 316' maintains a relatively constant voltage shift between the shifter reference voltage 314' and node 312' even during switching of the buffer 302' and even if the resistance of buffer 302' changes, for example. Thus, the bias voltage Va' at node 312' is substantially independent of the voltage division along the current path from supply 322' through level shifter 316' through node 312' through buffer 302' to reference 320'.

Also similar to switch 304, switch 502 operates in its first mode when a CMOS low output voltage is provided at output 308'. In this mode, switch 502 uses the first voltage control circuit to control the bias voltage Va' at node 312'. Unlike switch 304, the first voltage control circuit of switch 502 also includes a level shifter 504 and a level shifter reference voltage 506. Level shifter 504, in the same manner as level shifters 316 and 316', produces a relatively constant voltage shift $V_{LS2}$ from the level shifter reference voltage 506 even when buffer 302' is switching and may have a changing resistance, for example. Accordingly, when switch 318' is turned on by output 308' going low, this first voltage control circuit pulls voltage Va' up to some voltage Vat2 that is less than supply voltage 322', but is greater than the bias voltage Vat' that is provided by the second voltage control circuit. In particular $Vat2=V_{ref2}-V_{LS2}$ where Vat2 is the target bias voltage to be produced at node 312' by the first voltage control circuit, $V_{ref2}$ is the level shifter reference voltage 506 and $V_{LS2}$ is the relatively constant voltage shift produced by level shifter 504 from $V_{ref2}$ to node 312'. The voltage Vat2 is chosen such that $V_{ref1}'-V_{LS1}'<V_{ref2}-V_{LS2}$.

Figure 6:
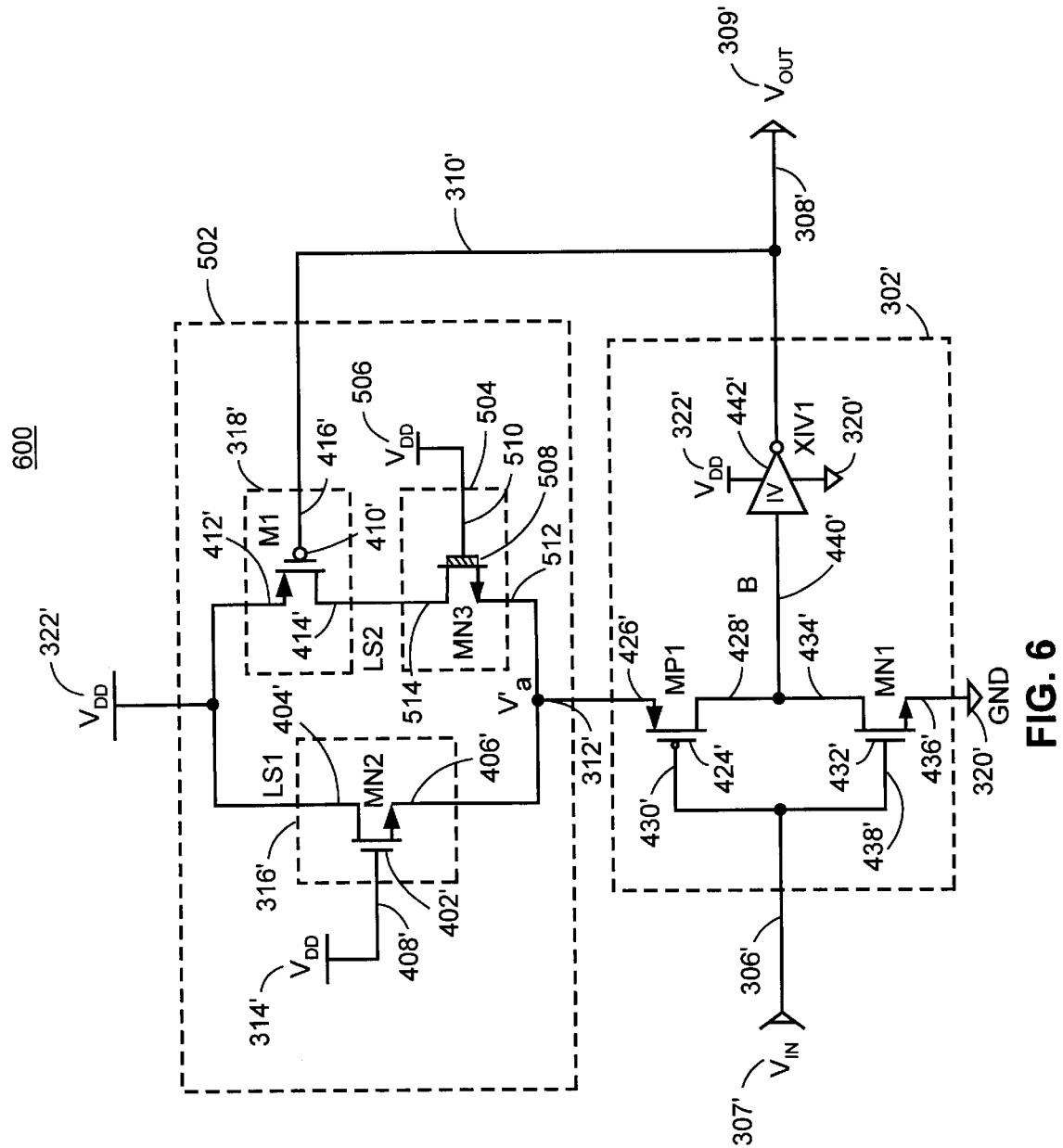
FIG. 6 is a schematic of a buffer 600 which is an alternate embodiment of the invention.

FIG. 6 shows a buffer 600 which is one possible implementation of the buffer 500 of FIG. 5. Buffer 500 is not limited to this particular implementation, however. Buffer 600 is similar to buffer 400. Components of buffer 600 that operate similarly to a buffer 400 component have been labeled with the same number as the buffer 400 component primed.

As illustrated in FIG. 6, buffer 600 uses a TTL buffer 302' and a power saving switch 502. The second voltage control circuit of the power saving switch 502, including the FET 402', operates in the same manner as the second voltage control circuit of buffer 400 in FIG. 4. Accordingly, it operates to maintain the voltage Va' at node 312' at a target bias Vat' such that $$Vat'=V_{ref1}'-V_{t402}'$$

where $V_{t402}'$ is the threshold voltage (i.e. gate to source voltage) required to turn on transistor 402'. In addition, level shifter 316', the reference voltage 314' and threshold voltage of FET 402' are designed to maintain the bias voltage Va' at level Vat' such that the difference between an intermediate high logic input voltage 307' ($V_{inh}'$) and the target bias voltage at node 312' (Vat') is less than the threshold voltage $V_{t424}'$ required to turn on FET 424'. In particular, level shifter 316' is designed to maintain $$Vat'-V_{inh}'<|V_{t424}'|; \text{ or}$$

$$Vat'<V_{inh}'+|V_{t424}'|.$$

As in buffer 400, by maintaining bias voltage Va' at such a level, FET 424' will turn off when an intermediate TTL high logic level is received at input 306'. Va' is set at such a level by adjusting reference voltage 314' and choosing a FET 402' that has an appropriate threshold voltage $V_{t402}'$. Accordingly, while the output 308' is at a CMOS high logic level and a TTL high logic level is present at input 306', level shifter 316', reference voltage 314' and FET 402' maintain a bias voltage Va' at node 312' such that FET 424' turns off even if the TTL high logic level at input 306' is an intermediate voltage (e.g. 2.0 volts) that is lower than a typical TTL high voltage of 2.4 to 5.0 volts. The input voltage at which this embodiment is designed to prevent buffer 302' from drawing current from node 312' by turning off FET 424' when node 312' is biased to voltage Vat' shall be called the input cutoff voltage. Both the level shifter reference voltage 314' and the threshold voltage of FET 402' can be adjusted to achieve the desired bias voltage Va'.

Additionally, buffer 600 operates to maintain the same relatively constant Va' in the same manner as did buffer 400. In particular, the gate 408' of FET 402' is coupled to the level shifter reference voltage 314' and the source 408' of FET 402' is coupled to the node 312' Accordingly, the gate to source voltage of FET 402' is the difference between the level shifter reference voltage 314' and the voltage Va' at node 312'. If voltage Va' moves below Vat', FET 402' turns on to pull Va' back to Vat, and voltage Va' is substantially prevented from moving above Vat' because FET 402' will turn off if Va' moves above Vat'. Thus, the difference between the level shifter reference voltage 314' and the bias voltage Va' at node 312 is maintained subtantially at the threshold voltage of FET 402'.

As described with respect to FIG. 5, the first voltage control circuit of buffer 600 includes the switch 318' and the level shifter 504. Similar to buffer 400, the switch 318' of buffer 600 is a P-channel enhancement mode FET 410' having its source 412' coupled to reference voltage 322' and its gate 416' coupled to output 308' using feedback path 310'. The drain 414' of FET 410' is coupled to voltage level shifter 504 rather than node 312', however. Voltage level shifter 504 is coupled to node 312'. The level shifter 504 is an N-channel enhancement mode FET 508 having its drain 514 coupled to drain 414' of FET 410', its source 512 coupled to node 312' and its gate 510 coupled to the level shifter reference voltage 506. Similar to FET 402', the gate to source voltage of FET 508 is the difference between the level shifter reference voltage 506 and the voltage Va' at node 312'. Accordingly, in substantially the same manner as was done by FETs 402 and 402', FET 508 maintains voltage Va' at a relatively constant target voltage Vat2. In particular, FET 508 produces a relatively constant voltage shift between level shifter reference voltage 506 and node 312' even when the resistance of buffer 302' is changing, such as when transistors 424' and 432' are switching and their resistances are changing. This voltage shift is substantially equal to the threshold voltage of FET 508. Also similar to buffer 400, the drain to source voltage of FET 410' can be neglected because FET 410' is biased into its triode region and its resistance is relatively low.

In one embodiment, FET 508 could be biased to be fully on for all of the voltages Va' that may be present at node 312'. Under such circumstances, FET 508 will be effectively eliminated from the circuit and buffer 600 will operate in substantially the same manner as buffer 400.

FET's 402', 410' and 424' can have the same characteristics as used in buffer 400. In the present embodiment, FET 508 is an "intrinsic" transistor similar to FET 424 of buffer 1000, except FET 508 is an NMOS transistor rather than a PMOS transistor. As a result, FET 508 has a lower magnitude threshold voltage than, for example, FET 402'. The different thresholds of FETs 402' and 508 enable the present embodiment to use the supply voltage 322' ($V_{DD}$) for both the level shifter reference voltages 314' and 506. In particular, we have noted that buffer 500 is designed such that $V_{ref1}'-V_{LS1}'<V_{ref2}-V_{LS2}$. Accordingly, the thresholds of FETs 402' and 508 are chosen such that $$V_{ref1}'-V_{t402}'<V_{ref2}-V_{t508}$$

where $V_{t402}'$ is the threshold voltage required to turn on FET 402 and $V_{t508}$ is the threshold voltage required to turn on FET 508. If the level shifter reference voltages 314' and 506 are the same, this condition can be satisfied by choosing FETs 402' and 508 such that $V_{t402}'<V_{t508}$. In alternate embodiments, FET 508 need not be an intrinsic transistor.

During low to high and high to low transitions on input 306', buffer 600 operates in the same manner as buffer 400, except when FET 410' turns on (i.e. output 308' is low), the voltage Va' is not pulled up to supply voltage 322', but is pulled up to the target reference voltage Vat2 determined by the level shifter 504. In particular, voltage Va' will be pulled up to a target voltage Vat2 such that $$Vat2=V_{ref2}-V_{t508}.$$

With this design, a TTL high to low transition on input 306' will produce a low to high transition at node 440' where the "high" voltage at node 440' is Vat2=$V_{ref2}-V_{508}$. Accordingly, the "high" voltage Vat2 has been chosen such that the inverter 442' does not draw current from node 322' when voltage Vat2 is applied to its input.

Figure 11:
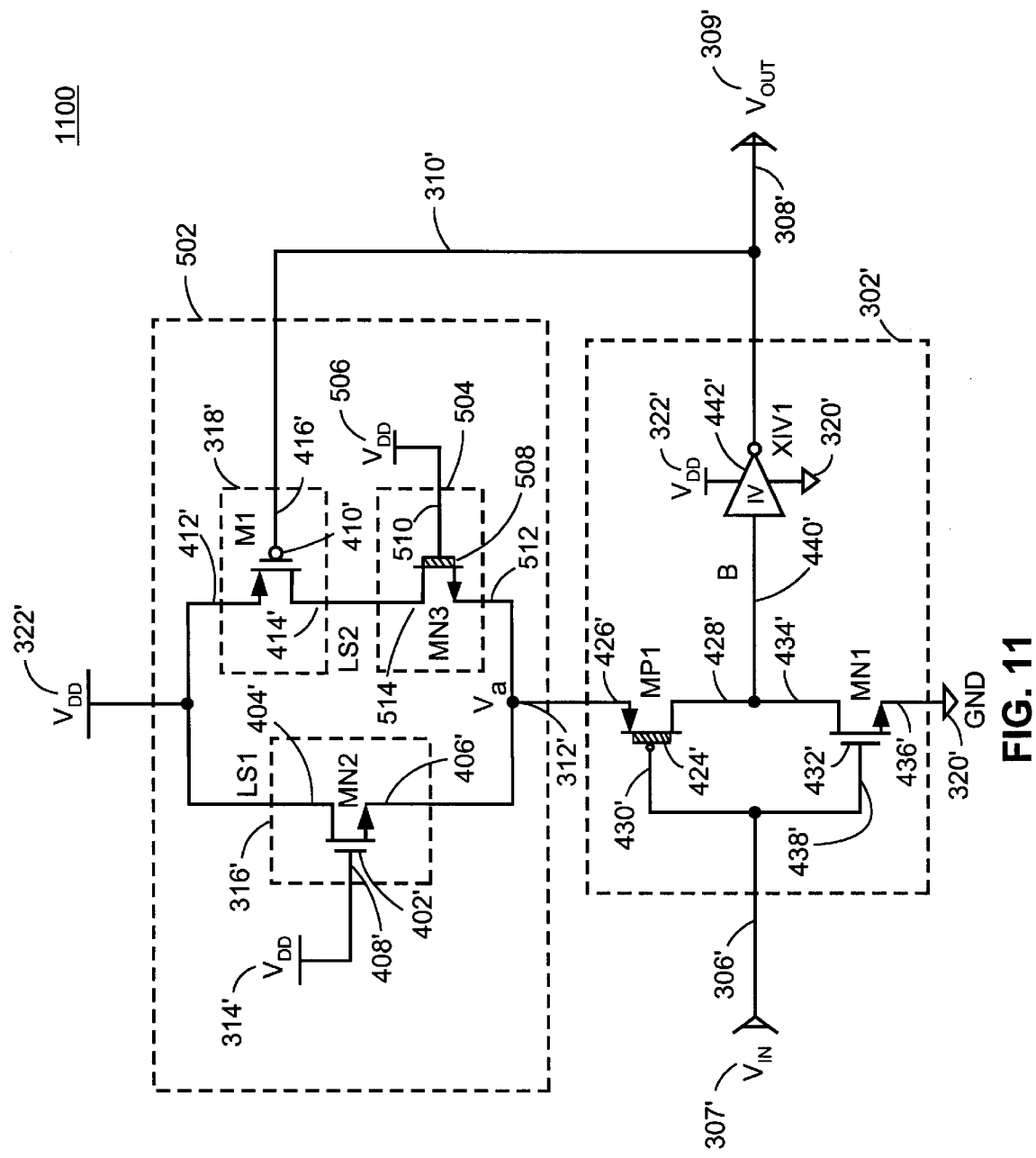
FIG. 11 is a schematic diagram of a buffer 1100 which is an alternate embodiment of the invention.

FIG. 11 illustrates buffer 1100 which is an alternate embodiment of buffer 600. Buffer 1100 is the same as buffer 600 except FET 424' is an intrinsic transistor similar to FET 424 of buffer 1000 and FET 508 in buffer 600. Accordingly, in buffer 1100 FET 424' has a lower threshold voltage than the FET 424' in buffer 600. In buffer 1100 the threshold voltage of FET 424' is about −1.4 to −1.5 volts. Changing the threshold voltage of FET 424' in this manner enables the response characteristics of the buffer to be tailored or fine tuned in a desired manner. While the threshold voltage of FET 424' has been changed by varying the channel doping, other techniques may be used.

Figure 7A:
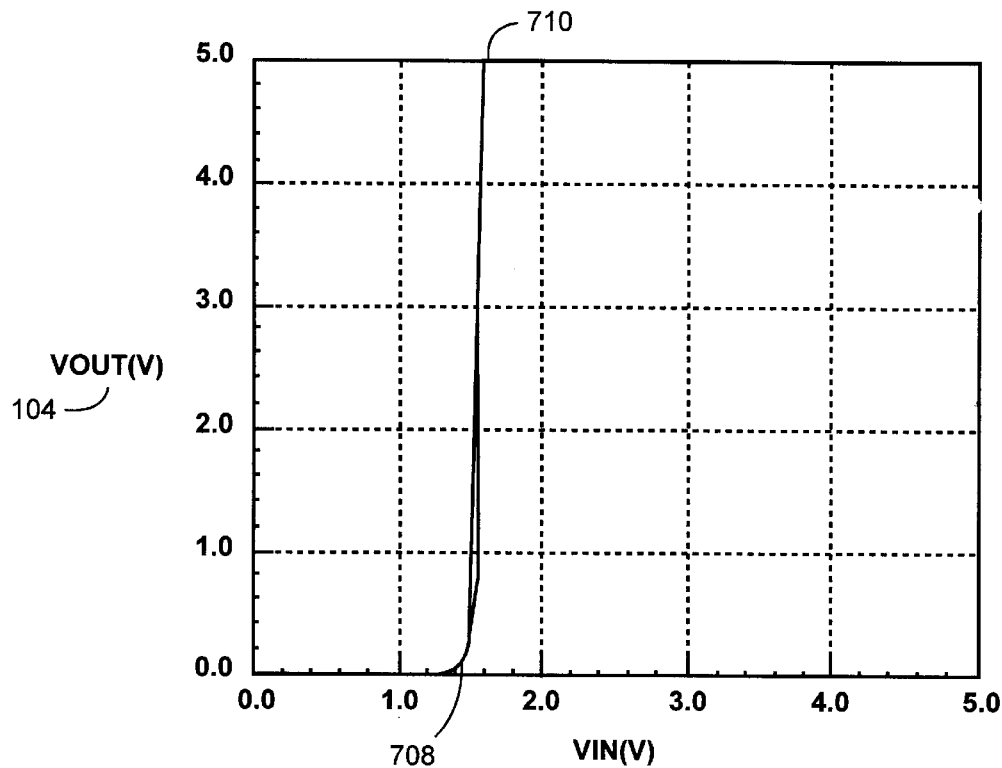
FIG. 7A illustrates a SPICE simulation of the input voltage versus output voltage response of an implementation of a conventional buffer 100.
Figure 7B:
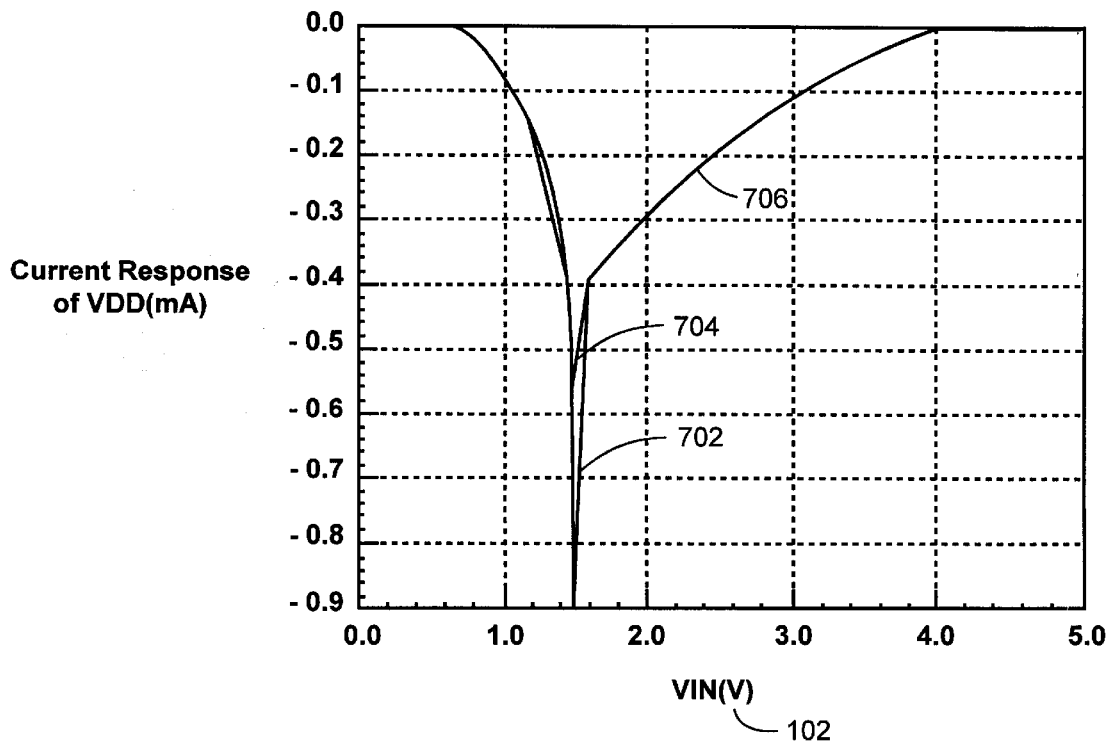
FIG. 7B illustrates a SPICE simulation of the input voltage versus $V_{DD}$ current response of an implementation of a conventional buffer 100.
Figure 8A:
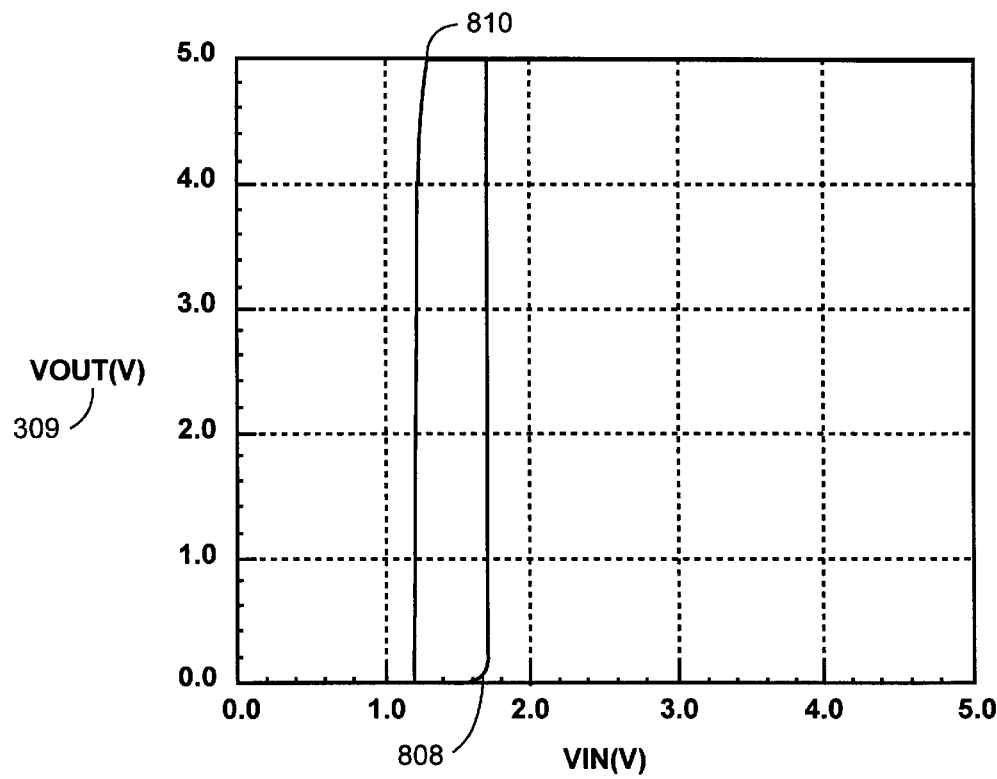
FIG. 8A illustrates a SPICE simulation of the input voltage versus output voltage response of an implementation of a buffer 400.
Figure 8B:
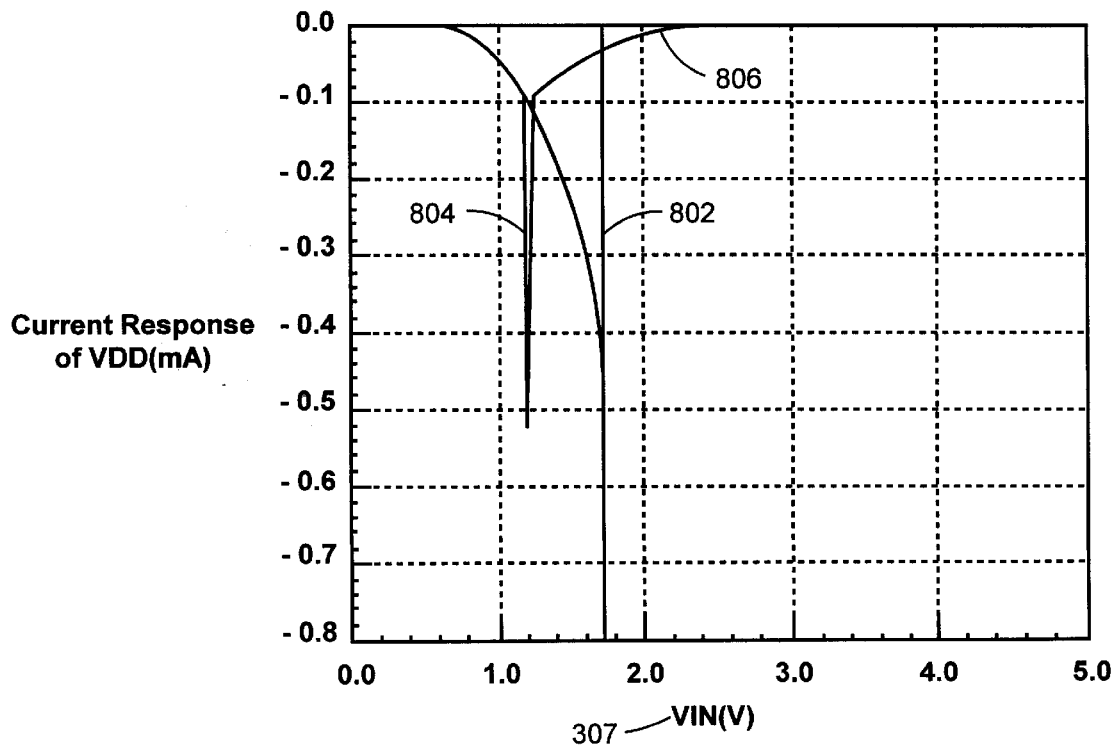
FIG. 8B illustrates a SPICE simulation of the input voltage versus $V_{DD}$ current response of an implementation of a buffer 400.
Figure 9A:
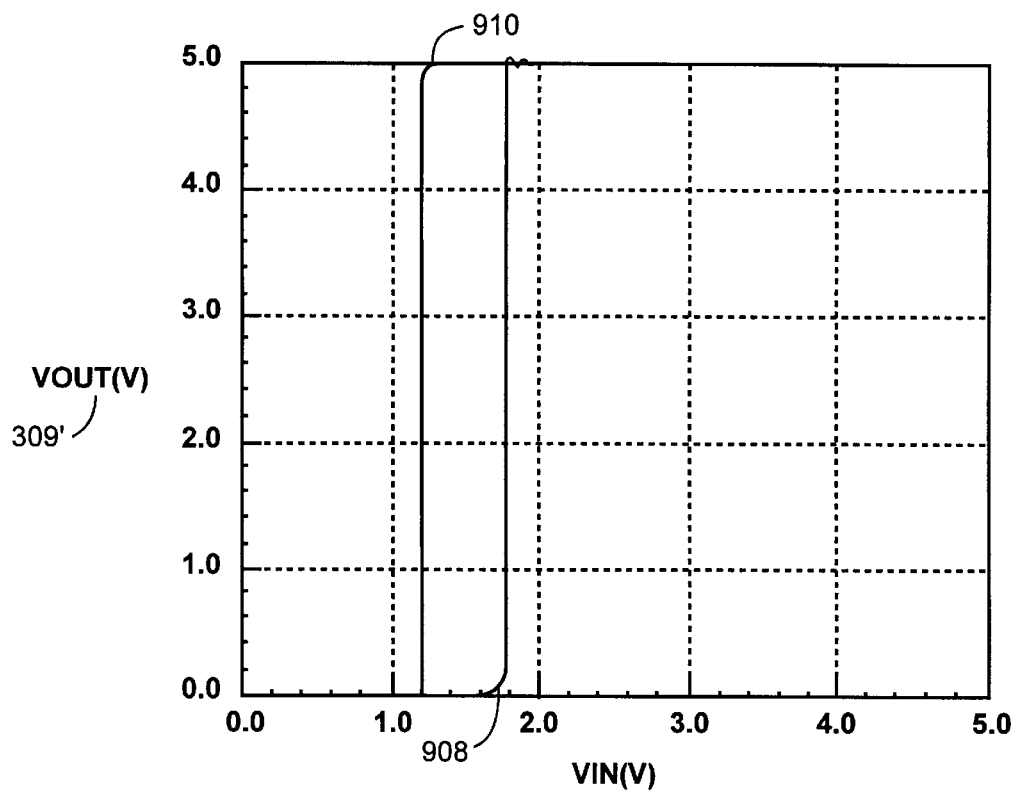
FIG. 9A illustrates a SPICE simulation of the input voltage versus output voltage response of an implementation of a buffer 600.
Figure 9B:
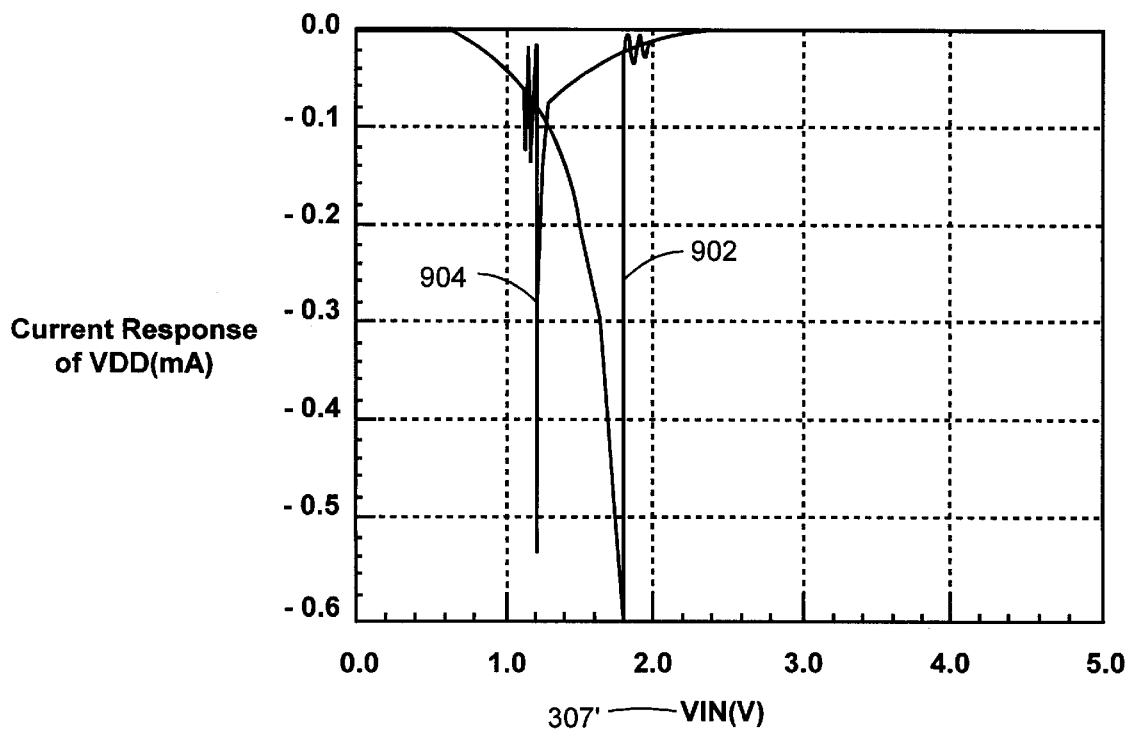
FIG. 9B illustrates a SPICE simulation of the input voltage versus $V_{DD}$ current response of an implementation of a buffer 600.

FIGS. 7A, 7B, 8A, 8B, 9A and 9B show SPICE simulations of one possible implementation of each of the buffers 100, 400 and 600. FIGS. 7A, 8A and 9A illustrate the input voltage versus output voltage responses of these buffers. FIGS. 7B, 8B and 9B illustrate the input voltage versus current flowing from the supply voltage $V_{DD}$ responses of these buffers. Table 1 shows parameters used in the SPICE simulations. Inverter 442 was simulated as an inverter comprising a PMOS transistor and an NMOS transistor. The simulations used a supply voltage of 5.0 volts. The implementations of buffers 400 and 600 in Table 1 have been designed for an expected input low logic level ($V_{IL}$) of about 0.8 volts and an expected input high logic level ($V_{IH}$) of about 2.4 volts. Accordingly, the desired low to high transition voltage $V_{TH}$ is slightly less than $V_{IH}$ and the desired high to low transition voltage $V_{TL}$ is slightly more than $V_{IL}$.

TABLE 1

| Component | | Buffer 100 | Buffer 400 | Buffer 600 |
| --- | --- | --- | --- | --- |
| Inverter | PMOS | 16/0.8 | 16/0.8 | 16/0.8 |
| 108/442/ | NMOS | 8/0.8 | 8/0.8 | 8/0.8 |
| 442' | | | | |
| FET 410/410' | | N/A | 10/1.2 | 40/1.2 |
| FET 112/424/424' | | 18/1.2 | 20/1.2 | 40/1.2 |
| FET 114/432/432' | | 15/1.2 | 12/1.2 | 4/1.2 |
| FET 402/402' | | N/A | 25/1.2 | 45/1.2 |
| FET 508 | | N/A | N/A | 60/1.2 |
| $V_{ref1}/V_{ref1}'$ | | N/A | VDD | VDD |
| $V_{ref2}$ | | N/A | N/A | VDD |

Devices sizes (W/L) used to simulate buffers 100, 400 and 600 (unit: μm) arid that produced the responses in FIGS. 7A–9B.

FIGS. 7A and 8A demonstrate that simulated buffer 400 has improved hysteresis characteristics over buffer 100. In particular, FIG. 7A shows relatively little or no hysteresis in the response of simulated buffer 100. The low to high transition of simulated buffer 100's output voltage 104 starts at point 708 when the input voltage 102 rises above about 1.4 volts. The high to low transition of output voltage 104, on the other hand, starts at point 710 when the input voltage 102 falls below about 1.5 or 1.6 volts. FIG. 8A shows that the low to high transition voltage $V_{TH}$ of simulated buffer 400's output voltage 309 occurs at point 808 when the input voltage 307 rises above about 1.6 or 1.7 volts. The high to low transition voltage $V_{TL}$ of output voltage 309, on the other hand, occurs at point 810 when the input voltage 307 falls to about 1.2 volts. This hysteresis characteristic provides enhanced immunity to switching caused by noise. FIG. 9A demonstrates that the hysteresis of simulated buffer 600 is comparable to that of simulated buffer 400. In particular, the low to high transition voltage $V_{TH}$ of simulated buffer 600's output voltage 309' occurs at point 908 when the input voltage 307' rises above about 1.7 volts or approaches about 1.8 volts. The high to low transition voltage $V_{TL}$ of output voltage 309', on the other hand, occurs at point 910 when the input voltage 307' falls to about 1.2 volts.

Figure 2:
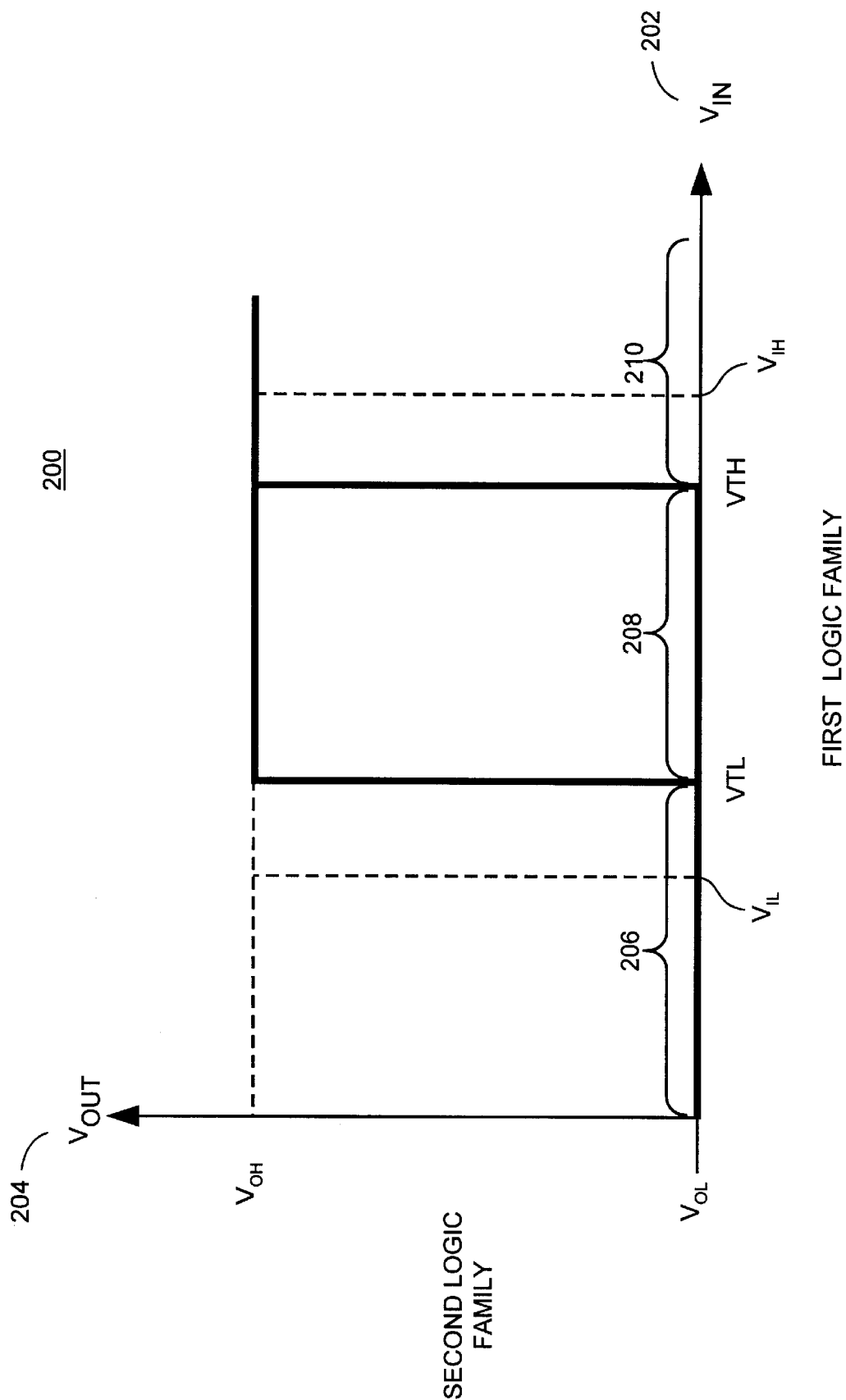
FIG. 2 illustrates a hysteresis characteristic that may be desired in a logic buffer.

As explained with respect to the hysteresis characteristic of FIG. 2, the hysteresis of these embodiments operates to enhance the noise immunity of the buffer as follows. In particular, hysteresis enhances the resistance of the buffer to noise when a low logic level such as $V_{IL}$ is present at the buffer input. Assuming the input voltage 202 in FIG. 2 is initially at a low logic level $V_{IL}$ (i.e. a voltage at or below $V_{TL}$ as illustrated by the range 206), the output voltage 204 will be a low logic $V_{OL}$. As illustrated in FIG. 2, the output voltage 204 remains at this low logic level even if the input voltage 202 moves above voltage $V_{TL}$ but does not reach voltage $V_{TH}$ (i.e. within the range 208). Such movement might be caused by noise at the buffer's input which causes the input voltage 202 to move above $V_{TL}$, for example. The output voltage 204 will not change to its high logic level $V_{OH}$ until the input voltage 202 changes to a high logic level (e.g. moves into the range 210 where the input voltage is $V_{TH}$ or higher) and remains at a high logic level for a required period of time. Accordingly, a definite transition of the input voltage, caused by a signal transition for example, will cause the buffer exhibiting hysteresis to respond in the desired manner. A buffer exhibiting hysteresis, however, will be resistant to transient noise that does not move the input voltage to or above $V_{TH}$ for the required period of time. In particular, transient noise will be less likely to cause the output voltage to change undesirably from low logic level $V_{OL}$ to high logic level $V_{OH}$ in the absence of a legitimate signal.

As illustrated in FIG. 2, hysteresis also enhances the immunity of a buffer to noise when a high logic level such as $V_{IH}$ is present at the buffer input. In particular, after the output voltage 204 has changed to $V_{OH}$ (i.e. region 210) in response to a high logic input voltage 202 of $V_{IH}$, for example, output voltage 204 will not transition from $V_{OH}$ to $V_{OL}$ even if the input voltage 202 moves below voltage $V_{TH}$ back into range 208, for example. Again, such movement might be caused by noise in the input voltage 202. The output voltage 204 only changes from $V_{OH}$ to $V_{OL}$ when the input voltage 202 moves to a low logic level (i.e. a voltage such as $V_{IL}$ in the range 206) for a required period of time. This hysteresis characteristic provides noise immunity by preventing small transients or voltage spikes at the input from undesirably changing the logic level of the output. As demonstrated by FIGS. 7A, 8A and 9A, the simulated embodiments exhibit enhanced hysteresis characteristics.

FIGS. 7B and 8B demonstrate that simulated buffer 400 reduces the current draw below that of simulated buffer 100 for both low to high and high to low transitions of the input voltage 102/307 and output voltage 104/309. In particular in FIG. 8B, current pulse 802 represents the current draw of a low to high transition of the input and output voltages, and current pulse 804 represents the current draw of a high to low transition of the input and output voltages. As shown by pulses 702 and 704 in FIG. 7B, the low to high and high to low transition current pulses are roughly the same as each other in the simulated device 100. Comparing area 706 of FIG. 7B to area 806 of FIG. 8B, for example, illustrates the current draw reduction achieved by the simulated buffer 400. Simulated buffer 600, as illustrated in FIG. 9B, while reducing the current draw when compared to simulated buffer 100, did not reduce the current quite as much as simulated buffer 400 as demonstrated by current pulses 902 and 904.

Table 2 illustrates one possible implementation of buffers 1000 and 1100 which use intrinsic transistors 424 and 424'. Alternate embodiments of the table 2 implementations need not use the intrinsic FETs 424 and 424'.

TABLE 2

| Component | | Buffer 1000 | Buffer 1100 |
| --- | --- | --- | --- |
| Inverter | PMOS | 16/0.8 | 16/0.8 |
| 442/442' | NMOS | 8/0.8 | 8/0.8 |
| FET 410/410' | | 20/1.2 | 60/1.2 |
| FET 424/424' | | 40/1.2 | 30/1.2 |
| FET 432/432' | | 20/1.2 | 4/1.2 |
| FET 402/402' | | 30/1.2 | 10/1.2 |
| FET 508 | | N/A | 50/1.2 |
| $V_{ref1}/V_{ref1}'$ | | VDD | VDD |
| $V_{ref2}$ | | N/A | VDD |

Devices sizes (W/L) used to simulate buffers 1000 and 1100 (unit: μm) and that produced the responses in FIGS. 12A–13B.

Figure 12A:
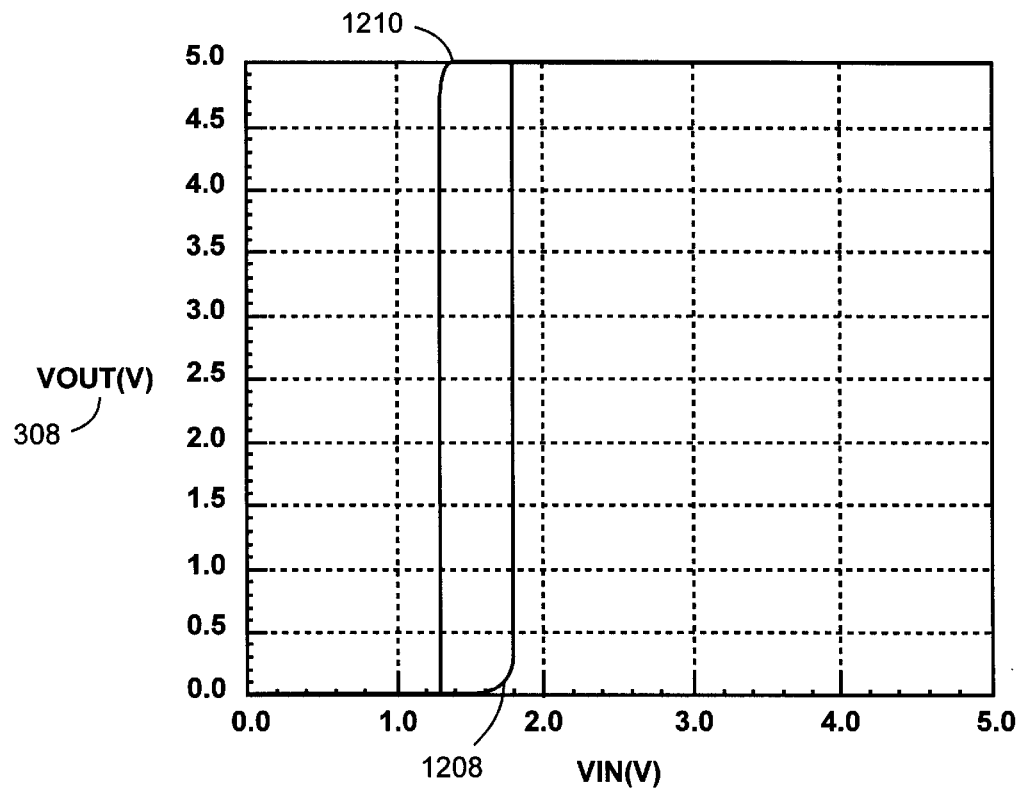
FIG. 12A illustrates a SPICE simulation of the input voltage versus output voltage response of an implementation of a buffer 1000.
Figure 12B:
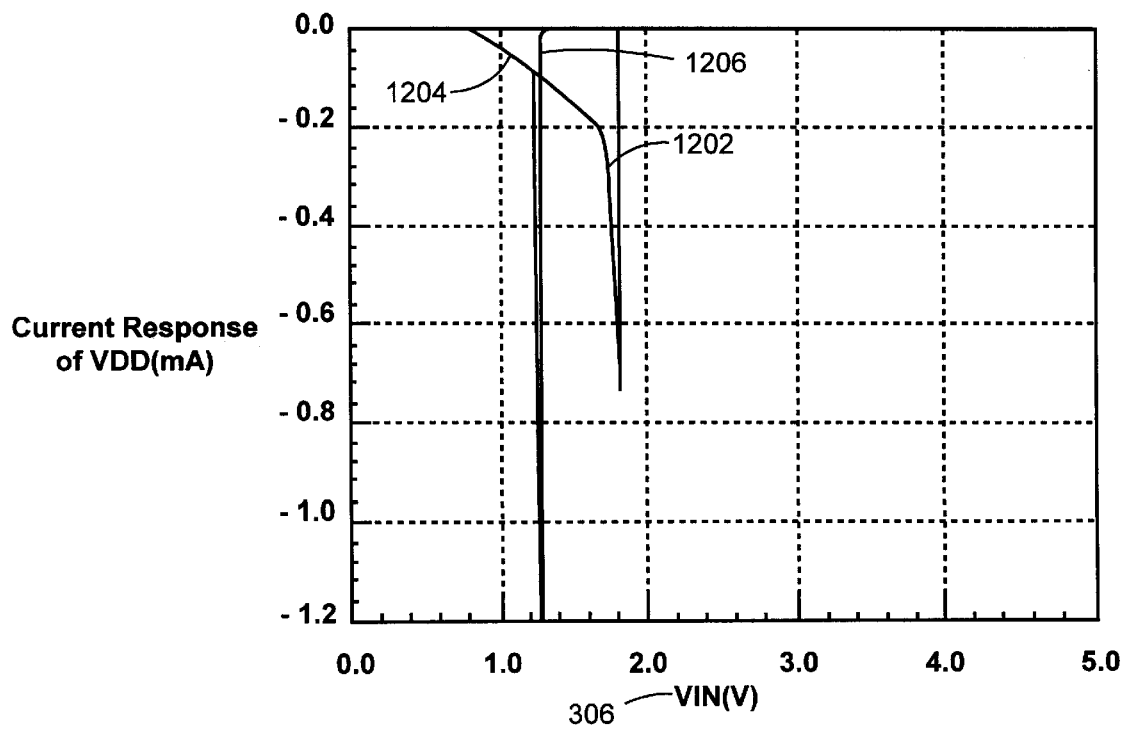
FIG. 12B illustrates a SPICE simulation of the input voltage versus $V_{DD}$ current response of an implementation of a buffer 1000.
Figure 13A:
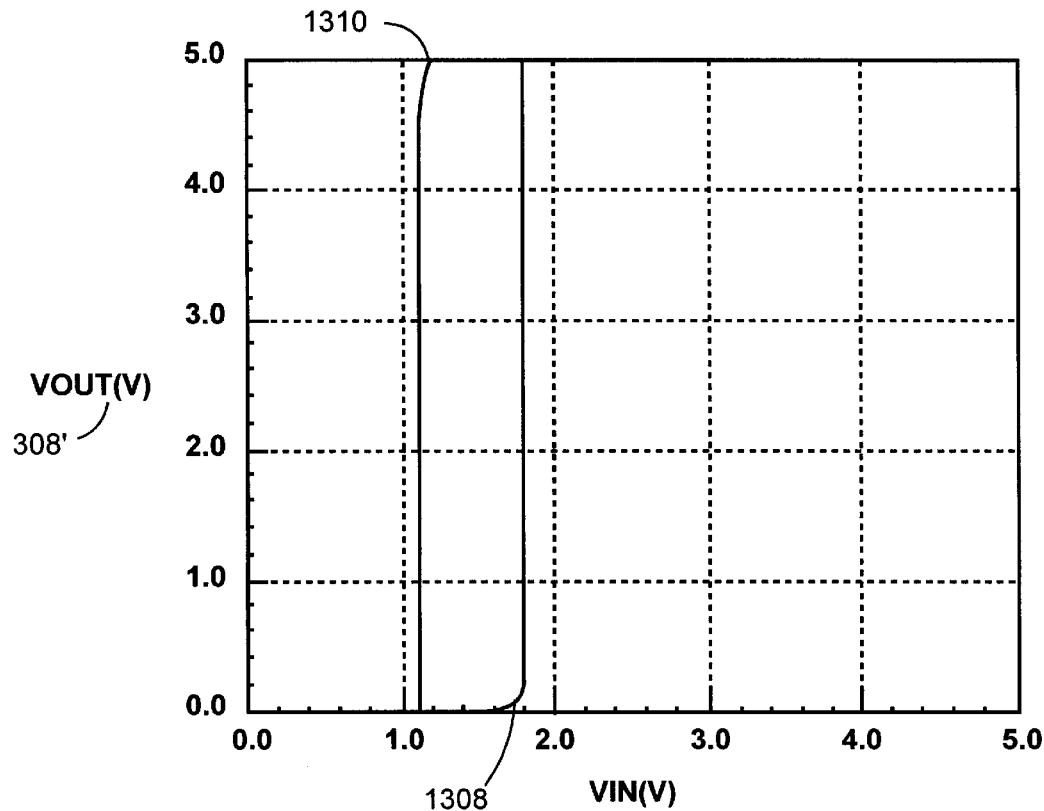
FIG. 13A illustrates a SPICE simulation of the input voltage versus output voltage response of an implementation of a buffer 1100.
Figure 13B:
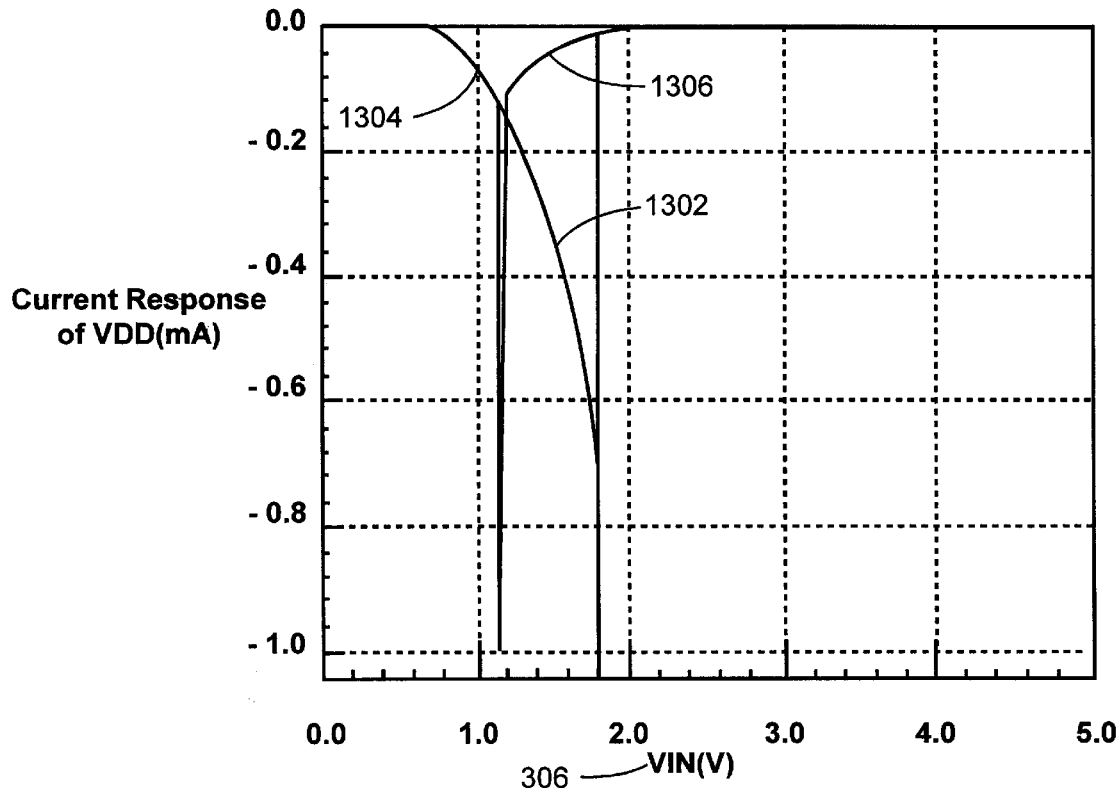
FIG. 13B illustrates a SPICE simulation of the input voltage versus $V_{DD}$ current response of an implementation of a buffer 1100.

FIGS. 12A, 12B, 13A and 13B illustrate SPICE simulations of this implementation of these buffers 1000 and 1100 that use intrinsic FETs 424 and 424'. FIGS. 12A and 13A illustrate the input voltage versus output voltage responses of these buffers. FIGS. 12B and 13B illustrate the input voltage versus current flowing from the supply voltage $V_{DD}$ response of these buffers. In these simulations the threshold voltages of the transistors are $V_{to}$ (enhancement PMOS)=−0.95 volts, $V_{to}$ (intrinsic PMOS)=−1.44 volts, $V_{to}$ (enhancement NMOS)=0.78 volts and $V_{to}$ (intrinsic NMOS)=0.47 volts, where $V_{to}$ is the threshold voltage without body effect. Again, inverter 442 was simulated as an inverter comprising a PMOS transistor and an NMOS transistor. The simulations used a supply voltage of 5.0 volts. The implementations of buffers 1000 and 1100 in Table 2 have been designed for an expected input low logic level ($V_{IL}$) of about 0.8 volts and an expected input high logic level ($V_{IH}$) of about 2.0 volts. Again, the desired low to high transition voltage $V_{TH}$ is slightly less than $V_{IH}$ and the desired high to low transition voltage $V_{TL}$ is slightly more than $V_{IL}$.

Comparing the simulation of the buffer 1000 implemenation in FIG. 12A to the simulation of the buffer 400 implemenation in FIG. 8A demonstrates that the hysteresis characteristics of these implementations are similar. The simulation in FIG. 12A suggests that $V_{TH}$ and $V_{TL}$ of the buffer 1000 implementation may shift up slightly as compared to the buffer 400 implementation. The simulation in FIG. 12B compared to FIG. 8B suggests that this implementation of buffer 1000 further improves current draw characteristics as compared to the buffer 400 implementation. In particular, current draw has been reduced as demonstrated by regions 1202, 1204 and 1206.

Comparing the simulation of the buffer 1100 implementation in FIG. 13A to the simulation of the buffer 600 implementation in FIG. 9A demonstrates that the buffer 1100 implementation improves noise margin characteristics. In particular, the transition point window has been widened as demonstrated by regions 1308 and 1310.

As these simulations demonstrate, the hysteresis characteristics of buffers 400, 600, 1000 and 1100 can be adjusted or tailored to a particular application by selection of their level shifter characteristics. In particular, moving the bias voltage Va will adjust the low to high and high to low transition points of the FETs 424 and 432 in buffer 302 and FETs 424' and 432' in buffer 302'. For example, as we have described, when output voltage 309 is high, voltage Va has been reduced to some voltage below the supply voltage 322 by a second voltage control circuit. A lower voltage Va at node 312 when a high to low transition is occuring at the input sets the hysteresis characteristics of the buffer 400 because it delays the high to low transition at the output 308 for a given high to low transition at the input 306. In particular, input 306 will have to go lower before FET 424 will turn on, starting the low to high transition at node 440 and high to low transition at output 308. In other words, $V_{TL}$ is reduced. Similarly, a higher Va and Va' at nodes 312 and 312', respectively, raises the input voltage at which FETs 424 and 424' will turn off, for example, so that a higher voltage during a low to high transition is required at the input 306 to cause the output 308 to go high. In other words, $V_{TH}$ is increased. By adjusting the thresholds of the level shifter transistors 402, 402' and 508 or the gate bias of these transistors, for example, the hysteresis characteristics of the buffer can be fine tuned to meet a particular need. As demonstrated by buffers 1000 and 1100, the thresholds of the various transistors can be adjusted by varying the doping of the transistors, for example. Other techniques to vary the thresholds might be used.

Also, the simulations suggest that embodiments of the present invention can be used to improve the static current draw of buffer circuits, for example. Static current draw might be reduced from a typical current draw of about 300 $\mu$A by a conventional device having a TTL high input level at its input to a current draw of about 5 $\mu$A by an embodiment of the present invention.

While Applicant has described the invention in terms of specific embodiments, the invention is not limited to or by the disclosed embodiments. The Applicant's invention may be applied beyond the particular systems mentioned as examples in this specification. In particular, embodiments of the invention may use other types of transistors. They may use bipolar transistors, for example. Embodiments of the invention need not be TTL to CMOS buffers. While the present embodiment used enhancement mode transistors, depletion mode transistor could also be used. The transistors used may be MOSFETs or other types of insulated gate FETs. The buffer used with the power saving switch need not be a digital buffer. Other supply and reference voltages may be used. In particular, in alternate embodiments, the supply voltage might be less than the reference voltage and appropriate modifications could be made. Intrinsic transistor could be used for transistors other than the ones specifically described (e.g. FET 402).

What is claimed is:

1. A power saving buffer circuit comprising:
   a bias node;
   a buffer having an input, an output and a bias connection wherein the bias connection of the buffer is coupled to the bias node, the buffer input is adapted to receive an input cutoff voltage and the buffer output is for providing an output voltage in a first range of output voltages and an output voltage in a second range of output voltages;
   a supply node; and
   a power saving switch coupled to the supply node and the bias node and having a feedback input coupled to the buffer output wherein the power saving switch is adapted to provide to the bias node a first bias voltage when the output voltage within the first range of output voltages is provided at the output and to provide to the bias node a second bias voltage when the output voltage within the second range of output voltages is provided at the output and wherein a voltage difference between the second bias voltage and the input cutoff voltage prevents current flow between the buffer and the bias node when the input cutoff voltage is provided at the input and the second bias voltage is provided at the bias node; and the power saving switch comprising:
   a level shifter reference voltage;
   a level shifter coupled to the supply node and the bias node and having a level shifter reference input coupled to the level shifter reference voltage wherein the level shifter is adapted to provide the second bias voltage to the bias node when the output voltage within the second range of output voltages is provided at the output and wherein the second bias voltage is determined by the level shifter reference voltage and a relatively constant voltage shift maintained by the level shifter between the level shifter reference voltage and the bias node; and
   a voltage control circuit coupled to the supply node and the bias node wherein the voltage control circuit includes the feedback input and wherein the voltage control circuit is adapted to provide the first bias voltage to the bias node when the output voltage within the first range of output voltages is provided at the output, and the voltage control circuit comprises:

a second level shifter coupled to the bias node and having a level shifter reference input.

2. The power saving buffer circuit of claim 1, wherein the level shifter comprises:
   a transistor having a gate coupled to the level shifter reference voltage and a source coupled to the bias node such that the relatively constant voltage shift is an absolute value of a gate to source threshold voltage of the transistor.

3. The power saving buffer circuit of claim 1, wherein the voltage control circuit further comprises:
   a transistor having a gate that provides the feedback input and having a source and a drain wherein at least one of the source and the drain is coupled to the supply node and the other of the source and the drain is coupled to the bias node through the second level shifter such that the transistor is adapted to provide the first bias voltage to the bias node when the output voltage within the first range of output voltages is provided at the output.

4. A power saving buffer circuit comprising:
   a bias node;
   a buffer having an input, an output and a bias connection wherein the bias connection of the buffer is coupled to the bias node, the buffer input is adapted to receive an input cutoff voltage and the buffer output is for providing an output voltage in a first range of output voltages and an output voltage in a second range of output voltages;
   a supply node; and
   a power saving switch coupled to the supply node and the bias node and having a feedback input coupled to the buffer output wherein the power saving switch is adapted to provide to the bias node a first bias voltage when the output voltage within the first range of output voltages is provided at the output and to provide to the bias node a second bias voltage when the output voltage within the second range of output voltages is provided at the output and wherein a voltage difference between the second bias voltage and the input cutoff voltage prevents current flow between the buffer and the bias node when the input cutoff voltage is provided at the input and the second bias voltage is provided at the bias node, and the power saving switch further having:
      a level shifter reference voltage;
      a level shifter coupled to the supply node and the bias node and having a level shifter reference input coupled to the level shifter reference voltage wherein the level shifter is adapted to provide the second bias voltage to the bias node when the output voltage within the second range of output voltages is provided at the output and wherein the second bias voltage is determined by the level shifter reference voltage and a relatively constant voltage shift maintained by the level shifter between the level shifter reference voltage and the bias node; and
      a voltage control circuit coupled to the supply node and the bias node wherein the voltage control circuit includes the feedback input and wherein the voltage control circuit is adapted to provide the first bias voltage to the bias node when the output voltage within the first range of output voltages is provided at the output, and the voltage control circuit including:
         a second level shifter coupled to the bias node and having a level shifter reference input;
         a second level shifter reference voltage coupled to the level shifter reference input of the second level shifter; and
         a first transistor having a gate that provides the feedback input and having a source and a drain wherein at least one of the source and the drain is coupled to the supply node and the other of the source and the drain is coupled to the second level shifter, wherein the second level shifter is adapted to provide the first bias voltage to the bias node when the output voltage within the first range of output voltages is provided at the output and wherein the first bias voltage is determined by the second level shifter reference voltage and a second relatively constant voltage shift maintained by the second level shifter between the second level shifter reference voltage and the bias node.

5. The power saving buffer circuit of claim 4, wherein the second level shifter comprises a level shifter transistor having a gate coupled to the second level shifter reference voltage and a source coupled to the bias node such that the second relatively constant voltage shift is an absolute value of a gate to source threshold voltage of the level shifter transistor.

6. The power saving buffer circuit of claim 5, wherein the second level shifter transistor comprises:
   a substrate having a background dopant concentration; and
   a channel doped with the background dopant concentration.

7. The power saving TTL to CMOS buffer circuit comprising:
   a bias node;
   a buffer having a TTL input and a CMOS output and a bias connection wherein the bias connection of the buffer is coupled to the bias node, the TTL input is adapted to receive an input cutoff voltage that is an intermediate TTL high logic level and the buffer output is for providing an output voltage in at least one of a CMOS high range of voltages and a CMOS low range of voltages;
   a supply node; and
   a power saving switch having a first and a second level shifter, and the power saving switch coupled to the supply node and the bias node wherein the power saving switch has a feedback input that is coupled to the CMOS output, wherein the power saving switch is adapted to provide to the bias node a first bias voltage through the second level shifter when the output voltage is within the CMOS low range of voltages and to provide to the bias node a second bias voltage through the first level shifter when the output voltage is within the CMOS high range of voltages and wherein a voltage difference between the second bias voltage and the input cutoff voltage will prevent current flow between the buffer and the bias node when the input cutoff voltage is provided at the TTL input and when the second bias voltage is provided at the bias node.

8. A power saving buffer circuit comprising:
   a buffer input for receiving an input voltage that is within at least one of an input high logic range of voltages and an input low logic range of voltages;
   a first transistor having a gate coupled to the buffer input and having a source, a drain and a threshold voltage;
   a second transistor having a gate coupled to the buffer input and having a source and a drain;

a supply node for providing a supply voltage;

a reference node for providing a reference voltage;

a bias node;

an invertor having an invertor input and an output wherein the source of the first transistor is coupled to the bias node, and the drain of the first transistor is coupled to the invertor input, wherein one of the source and drain of the second transistor is coupled to the invertor input, and the other of the source and the drain of the second transistor is coupled to the reference node and wherein the output is adapted to provide an output voltage that is within at least one of an output high logic range of voltages and an output low logic range of voltages;

a first level shifter transistor having a gate, a source, a drain and a threshold voltage wherein one of the source and drain of the first level shifter transistor is coupled to the supply node and the other of the source and drain of the first level shifter transistor is coupled to the bias node;

a voltage control circuit that is coupled to the output, the supply node and the bias node such that the voltage control circuit provides a first bias voltage to the bias node when the output voltage is in one of the output low and high logic range of voltages and such that the voltage control circuit does not provide the first bias voltage to the bias node when the output voltage is in the other of the output low and high logic range of voltages, and the voltage control circuit comprises:

a second level shifter coupled to the bias node and having a level shifter reference input; and a level shifter reference voltage coupled to the gate of the first level shifter transistor such that the first level shifter transistor provides a second bias voltage to the bias node when the voltage control circuit does not provide the first bias voltage to the bias node wherein the second bias voltage is less than the sum of an absolute value of the threshold voltage of the first transistor and an input cutoff voltage and wherein the input cutoff voltage is a voltage at which the first transistor turns off when the second bias voltage is provided at the bias node and the input cutoff voltage is applied to the input.

9. The power saving buffer circuit of claim 8, wherein the input high logic range of voltages comprises a voltage range of about 2 volts and higher.

10. The power saving buffer circuit of claim 9, wherein the input cutoff voltage comprises about 2 volts.

11. The power saving buffer circuit of claim 8, wherein the input cutoff voltage comprises a lowest absolute value of a voltage in the input high logic range of voltages.

12. The power saving buffer circuit of claim 8, wherein the input low logic range of voltages comprises a voltage range of about 0.8 volts and lower.

13. The power saving buffer circuit of claim 8, wherein the output high logic range of voltages comprises a voltage range of about 4.7 volts and higher.

14. The power saving buffer circuit of claim 8, wherein the output low logic range of voltages comprises a voltage range of about 0.3 volts and lower.

15. The power saving buffer circuit of claim 8, wherein the input high and low logic voltage ranges comprise TTL ranges and the output high and low logic voltage ranges comprise CMOS ranges.

16. The power saving buffer circuit of claim 8, wherein the first transistor comprises a P-channel field effect transistor.

17. The power saving buffer circuit of claim 8, wherein the second transistor comprises an N-channel field effect transistor.

18. The power saving buffer circuit of claim 8, wherein the first level shifter transistor comprises an N-channel field effect transistor.

19. The power saving buffer circuit of claim 8, wherein the source of the second transistor is coupled to the reference node and the drain of the second transistor is coupled to the invertor input.

20. The power saving buffer circuit of claim 8, wherein the first transistor comprises:

a substrate having a background dopant concentration; and a channel doped with the background dopant concentration.

21. The power saving buffer circuit of claim 20, wherein the first transistor comprises a PMOS transistor.

22. The power saving buffer circuit of claim 8, wherein the first bias voltage is at or near the supply voltage.

23. The power saving buffer circuit of claim 22, wherein the voltage control circuit further comprises:

a third transistor having a source, a gate and a drain wherein one of the source and drain of the third transistor is coupled to the supply node, the other of the source and drain of the third transistor is coupled to the bias node through the second level shifter and the gate of the third transistor is coupled to the output.

24. The power saving buffer circuit of claim 23, wherein the source of the third transistor is coupled to the supply node and the drain of the third transistor is coupled to the bias node.

25. The power saving buffer circuit of claim 23, wherein the third transistor comprises a P-channel field effect transistor.

26. The power saving buffer circuit of claim 8, wherein the first bias voltage comprises a voltage having a smaller magnitude than the supply voltage.

27. A power saving buffer circuit comprising:

a buffer input for receiving an input voltage that is within at least one of an input high logic range of voltages and an input low logic range of voltages;

a first transistor having a gate coupled to the buffer input and having a source, a drain and a threshold voltage;

a second transistor having a gate coupled to the buffer input and having a source and a drain;

a supply node for providing a supply voltage;

a reference node for providing a reference voltage;

a bias node;

a first bias voltage;

a second bias voltage;

an invertor having an invertor input and an output wherein the source of the first transistor is coupled to the bias node, and the drain of the first transistor is coupled to the invertor input, wherein one of the source and drain of the second transistor is coupled to the invertor input, and the other of the source and the drain of the second transistor is coupled to the reference node and wherein the output is adapted to provide an output voltage that is within at least one of an output high logic range of voltages and an output low logic range of voltages;

a first level shifter transistor having a gate, a source, a drain and a threshold voltage wherein one of the source and drain of the first level shifter transistor is coupled to the supply node and the other of the source and drain of the first level shifter transistor is coupled to the bias node;

a first level shifter reference voltage coupled to the gate of the first level shifter transistor such that the first level shifter transistor provides the second bias voltage to the bias node when the voltage control circuit does not provide the first bias voltage to the bias node wherein the second bias voltage is less than the sum of an absolute value of the threshold voltage of the first transistor and an input cutoff voltage and wherein the input cutoff voltage is a voltage at which the first transistor turns off when the second bias voltage is provided at the bias node and the input cutoff voltage is applied to the input; and a voltage control circuit that is coupled to the output, the supply node and the bias node such that the voltage control circuit provides the first bias voltage to the bias node when the output voltage is in one of the output low and high logic range of voltages and such that the voltage control circuit does not provide the first bias voltage to the bias node when the output voltage is in the other of the output low and high logic range of voltages, and the first bias voltage having a smaller magnitude than the supply voltage, and the voltage control circuit comprises:

a third transistor having a gate coupled to the output and having one of a source and a drain coupled to the supply node; and a second level shifter transistor having a source, a gate, a drain and a threshold voltage wherein the second level shifter transistor is coupled between the supply node and the bias node in series with the third transistor, and the gate of the second level shifter transistor is coupled to a second level shifter reference voltage.

28. The power saving buffer circuit of claim 27, wherein the drain of the second level shifter transistor is coupled to one of the source and drain of the third transistor and the source of the second level shifter transistor is coupled to the bias node such that the first bias voltage is the second level shifter reference voltage shifted by an absolute value of the threshold voltage of the second level shifter transistor.

29. The power saving buffer circuit of claim 27, wherein an absolute value of the threshold voltage of the second level shifter transistor has a smaller magnitude than an absolute value of the threshold voltage of the first level shifter transistor.

30. The power saving buffer circuit of claim 27, wherein the first and second level shifter reference voltages are at or near the supply voltage.

31. The power saving buffer circuit of claim 27, wherein the second level shifter transistor comprises an N-channel field effect transistor.

32. The power saving buffer circuit of claim 27, wherein the third transistor comprises a P-channel field effect transistor.

33. The power saving buffer circuit of claim 27, wherein the second level shifter transistor comprises:

a substrate having a background dopant concentration; and a channel doped with the background dopant concentration.

34. The power saving buffer circuit of claim 33, wherein the second level shifter transistor comprises an NMOS transistor.

35. The power saving buffer circuit of claim 33, wherein the first transistor comprises:

a substrate having a background dopant concentration; and a channel doped with the background dopant concentration.

36. The power saving buffer circuit of claim 35, wherein the first transistor comprises a PMOS transistor.

37. The power saving buffer circuit of claim 8, wherein the invertor is coupled to the supply node and the reference node.

38. The power saving buffer circuit of claim 8, wherein the invertor comprises:

a first invertor transistor having a source, a gate and a drain wherein the gate of the first invertor transistor is coupled to the invertor input; and a second invertor transistor having a source, a gate and a drain wherein the gate of the second invertor transistor is coupled to the invertor input, the source of the first invertor transistor is coupled to the supply node, the drain of the first invertor transistor is coupled to the output, one of the source and the drain of the second invertor transistor is coupled to the output and the other of the source and the drain of the second invertor transistor is coupled to the reference node.

39. The power saving buffer circuit of claim 38, wherein the drain of the second invertor transistor is coupled to the output and the source of the second invertor transistor is coupled to the reference node.

40. The power saving buffer circuit of claim 38, wherein the first invertor transistor comprises a P-channel field effect transistor.

41. The power saving buffer circuit of claim 38, wherein the second invertor transistor comprises an N-channel field effect transistor.

42. A power saving buffer circuit comprising:

a buffer input;

a first transistor having a gate coupled to the buffer input and having a source, a drain and a threshold voltage;

a second transistor having a gate coupled to the buffer input and having a source and a drain;

a supply node;

a reference node;

a bias node;

an invertor coupled to the supply node and the reference node and having an invertor input and an output wherein the source of the first transistor is coupled to the bias node, and the drain of the first transistor is coupled to the invertor input, wherein at least one of the source and drain of the second transistor is coupled to the invertor input, and the other of the source and the drain of the second transistor is coupled to the reference node;

a first level shifter transistor having a gate, a source, a drain and a threshold voltage wherein at least one of the source and drain of the first level shifter transistor is coupled to the supply node and the other of the source and drain of the first level shifter transistor is coupled to the bias node;

a first level shifter reference voltage coupled to the gate of the first level shifter transistor;

a third transistor having a gate coupled to the output and having a source and a drain;

a second level shifter transistor having a source, a gate, a drain and a threshold voltage wherein at least one of the source and drain of the third transistor is coupled to the supply node, the other of the source and drain of the third transistor is coupled to at least one of the source and drain of the second level shifter transistor, the other of the source and drain of the second level shifter transistor is coupled to the bias node, and the gate of the second level shifter transistor is coupled to a second level shifter reference voltage;

a first bias voltage at the bias node when a first output voltage is at the output, and a second bias voltage at the bias node when a second output voltage is at the output wherein the second bias voltage is less than the sum of an absolute value of the threshold voltage of the first transistor and an input cutoff voltage.

43. The power saving buffer circuit of claim 42, wherein at least one of the first transistor and the second level shifter transistor comprises:

a substrate having a background dopant concentration; and a channel doped with the background dopant concentration.

44. A method for lowering current consumption of a buffer circuit from a supply voltage, comprising:

setting a first bias voltage level for a buffer circuit bias in response to a first output voltage range from the output of the buffer circuit; and setting a second bias voltage level for the buffer circuit bias in response to a second output voltage range from the output of the buffer circuit, wherein a magnitude of the first bias voltage level and a magnitude of the second bias voltage level are less than a magnitude of the supply voltage.

45. The method of claim 44, wherein a switch coupled to the buffer circuit output allows the setting of the second bias voltage ceiling.

46. The method of claim 44, wherein the second bias voltage level is greater than the first bias voltage level, and both the first and second bias voltage levels are less than the supply voltage.

47. The method of claim 44, wherein the second bias voltage level is less than the first bias voltage level, and both the first and second bias voltage levels are greater than the supply voltage.

* * * * *